(12) United States Patent
Taneda et al.

(10) Patent No.: US 10,905,005 B2
(45) Date of Patent: Jan. 26, 2021

(54) WIRING BOARD, LAMINATED WIRING BOARD, AND SEMICONDUCTOR DEVICE

(71) Applicant: SHINKO ELECTRIC INDUSTRIES CO., LTD., Nagano (JP)

(72) Inventors: Hiroshi Taneda, Nagano (JP); Yukari Chino, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/554,829

(22) Filed: Aug. 29, 2019

(65) Prior Publication Data

US 2020/0092993 A1   Mar. 19, 2020

(30) Foreign Application Priority Data

Sep. 18, 2018   (JP) ................................ 2018-174247

(51) Int. Cl.
| | |
|---|---|
| *H05K 1/02* | (2006.01) |
| *H05K 3/42* | (2006.01) |
| *H05K 1/11* | (2006.01) |
| *H05K 3/46* | (2006.01) |
| *H05K 1/18* | (2006.01) |

(52) U.S. Cl.
CPC .......... *H05K 1/0298* (2013.01); *H05K 1/115* (2013.01); *H05K 1/181* (2013.01); *H05K 3/421* (2013.01); *H05K 3/4623* (2013.01); *H05K 3/423* (2013.01)

(58) Field of Classification Search
CPC .. H05K 1/00; H05K 1/02; H05K 1/03; H05K 1/18; H05K 1/036; H05K 1/0206; H05K 1/181–187; H05K 3/421; H05K 3/4623; H01L 21/486; H01L 21/4857; H01L 23/49822; H01L 23/5383
USPC ......... 361/761–767, 792–795; 174/250–259; 257/685–730
See application file for complete search history.

(56) References Cited

U.S. PATENT DOCUMENTS

| | | | |
|---|---|---|---|
| 9,668,341 B2 | 5/2017 | Furuichi et al. | |
| 10,262,932 B2 | 4/2019 | Furuichi et al. | |

(Continued)

FOREIGN PATENT DOCUMENTS

| | | |
|---|---|---|
| JP | 2015-050314 | 3/2015 |
| JP | 2016-225415 | 12/2016 |
| JP | 2017-157666 | 9/2017 |

*Primary Examiner* — Tuan T Dinh
(74) *Attorney, Agent, or Firm* — IPUSA, PLLC

(57) ABSTRACT

A wiring board includes a first interconnect layer, a first insulating layer covering the first interconnect layer, a second interconnect layer, thinner than the first interconnect layer, formed on the first insulating layer and having an interconnect density higher than that of the first interconnect layer, and a second insulating layer formed on the first insulating layer and covering the second interconnect layer. The first insulating layer includes a first layer including no reinforcing material, and a second layer including a reinforcing material. The first and second layers include a non-photosensitive thermosetting resin as a main component thereof. The first layer has a coefficient of thermal expansion higher than that of the second layer, and the second insulating layer includes a photosensitive resin as a main component thereof. The second interconnect layer includes an interconnect formed directly on and electrically connected to the first interconnect layer.

20 Claims, 13 Drawing Sheets

(56) References Cited

U.S. PATENT DOCUMENTS

| | | | |
|---|---|---|---|
| 2005/0218503 A1* | 10/2005 | Abe | H05K 1/09 257/700 |
| 2011/0198114 A1* | 8/2011 | Maeda | H01L 23/49811 174/257 |
| 2012/0227261 A1* | 9/2012 | Inui | H05K 1/0206 29/849 |
| 2014/0021625 A1* | 1/2014 | Nakamura | H01L 23/145 257/773 |
| 2015/0016079 A1* | 1/2015 | Furutani | H01L 24/19 361/763 |
| 2015/0060127 A1 | 3/2015 | Terui et al. | |
| 2015/0181703 A1* | 6/2015 | Tanaka | H05K 1/0298 361/748 |
| 2015/0245473 A1* | 8/2015 | Shimizu | H05K 1/036 257/778 |
| 2015/0282307 A1* | 10/2015 | Shimizu | H01L 23/5383 174/264 |
| 2017/0170130 A1* | 6/2017 | Kaneda | H01L 23/3114 |
| 2017/0256482 A1* | 9/2017 | Furuichi | H01L 21/4857 |
| 2017/0352628 A1* | 12/2017 | Furuichi | H01L 23/49827 |

* cited by examiner

WIRING BOARD, LAMINATED WIRING BOARD, AND SEMICONDUCTOR DEVICE

CROSS-REFERENCE TO RELATED APPLICATION

This application is based upon and claims priority to Japanese Patent Application No. 2018-174247, filed on Sep. 18, 2018, the entire contents of which are incorporated herein by reference.

FIELD

Certain aspects of the embodiments discussed herein are related to a wiring board, a laminated wiring board, and a semiconductor device.

BACKGROUND

There are known wiring boards having a micro interconnect structure which includes an interconnect layer with a high interconnect density. One example of the wiring board, such as that described in Japanese Laid-Open Patent Publication No. 2016-225415, for example, includes the micro interconnect structure formed on a base board. Another example of the wiring board, such as that described in Japanese Laid-Open Patent Publication No. 2017-157666, for example, includes the micro interconnect structure which uses a photosensitive resin, formed on a coreless base board which uses a thermosetting resin mixed with a reinforcing material.

However, when manufacturing the wiring board having the micro interconnect structure formed on the base board, the micro interconnect structure which is difficult to manufacture is formed last. For this reason, when a defect or the like is generated during the manufacture of the micro interconnect structure, manufacturing processes preceding the manufacture of the micro interconnect structure will be wasted.

In the wiring board having the micro interconnect structure formed on the base board, the base board may include the thermosetting resin, and the micro interconnect structure may include a photosensitive resin. In general, the coefficient of thermal expansion of the photosensitive resin is larger than the coefficient of thermal expansion of the thermosetting resin. Further, in general, the curing temperature of the photosensitive resin is higher than the curing temperature of the thermosetting resin. For these reasons, the shrinkage force when the photosensitive resin returns to room temperature tends to be larger than the shrinkage force when the thermosetting resin returns to room temperature. Consequently, the wiring board may become warped due to the difference between the shrinkage forces when the photosensitive resin and the thermosetting resin return to room temperature.

For example, Japanese Laid-Open Patent Publication No. 2015-050314 describes a micro wiring board having a base board, and an interconnect layer with a high interconnect density, which are manufactured separately and thereafter bonded, to be used in place of the wiring board having the micro interconnect structure formed on the base board.

However, when the base board and the micro wiring board are manufactured separately and thereafter bonded, it is difficult to bond the micro wiring board on the base board due to the poor rigidity of the micro wiring board. It is particularly difficult to bond the micro wiring board on the base board when the micro wiring board is greatly warped.

SUMMARY

Accordingly, it is an object in one aspect of the embodiments to provide a wiring board including an interconnect layer having a high interconnect density, a high rigidity, and reduced warp.

According to one aspect of the embodiments, a wiring board includes a first interconnect layer; a first insulating layer covering the first interconnect layer; a second interconnect layer, thinner than the first interconnect layer, formed on a first surface of the first insulating layer, the second interconnect layer having an interconnect density higher than an interconnect density of the first interconnect layer; and a second insulating layer, formed on the first surface of the first insulating layer, and covering the second interconnect layer, wherein the first insulating layer includes a first layer including no reinforcing material and located on a side closer to the first interconnect layer, and a second layer laminated on the first layer and including a reinforcing material, wherein the first layer and the second layer respectively include a non-photosensitive thermosetting resin as a main component thereof, wherein the first layer has a coefficient of thermal expansion higher than a coefficient of thermal expansion of the second layer, wherein the second insulating layer includes a photosensitive resin as a main component thereof, and wherein the second interconnect layer includes an interconnect formed directly on the first surface of the first insulating layer and electrically connected to the first interconnect layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
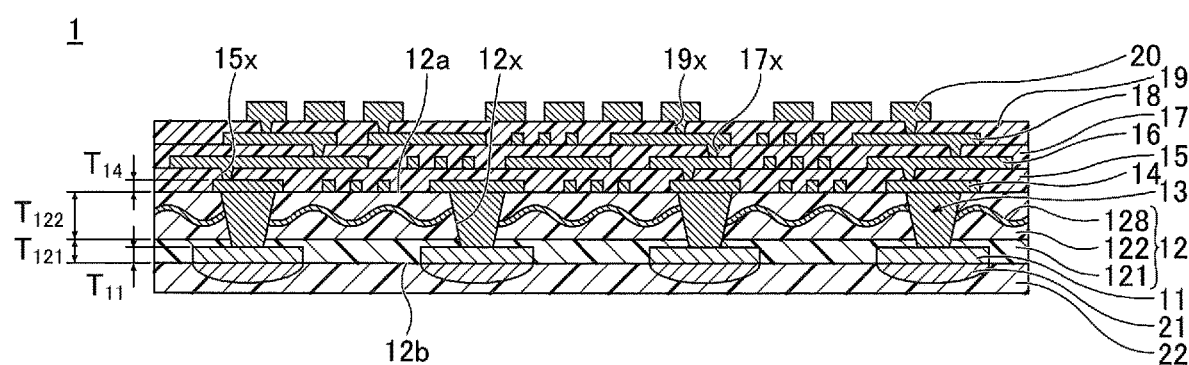
FIG. 1 is a cross sectional view illustrating an example of a wiring board according to a first embodiment.

Preferred embodiments of the present invention will be described with reference to the accompanying drawings. In the drawings, those parts that are the same are designated by the same reference numerals, and a repeated description of the same parts may be omitted.

A description will now be given of a wiring board, a laminated wiring board, and a semiconductor device according to each embodiment according to the present invention.

First Embodiment

[Structure of Wiring Board According to First Embodiment]

First, the structure of the wiring board according to a first embodiment will be described. FIG. 1 is a cross sectional view illustrating an example of the wiring board according to the first embodiment.

As illustrated in FIG. 1, a wiring board 1 according to the first embodiment includes an interconnect layer 11, an insulating layer 12, an interconnect layer 13, an interconnect layer 14, an insulating layer 15, an interconnect layer 16, an insulating layer 17, an interconnect layer 18, an insulating layer 19, an interconnect layer 20, a solder layer 21, and a bonding layer 22. A planar shape of the wiring board 1 may be a square shape having a side of 40 mm. However, the planar shape of the wiring board 1 is not limited to the square shape, and the wiring board 1 may have an arbitrary planar shape.

In this embodiment, for the sake of convenience, a side of the wiring board 1, provided with the interconnect layer 20, may also be referred to as an upper side or a first side of the wiring board 1, and a side of the wiring board 1, provided with the bonding layer 22 and opposite to the first side, may also be referred to as a lower side or a second side of the wiring board 1. In addition, a surface of each part on the first side of the wiring board 1 provided with the interconnect layer 20 may also be referred to as a first surface or an upper surface of each part, and a surface of each part on the second side of the wiring board 1 provided with the bonding layer 22 and opposite to the first surface, may also be referred to as a second surface or a lower surface of each part. However, the wiring board 1 may of course be used in a state upside-down with respect to the state illustrated in FIG. 1, or in a state inclined with respect to the state illustrated in FIG. 1. Further, the plan view of an object refers to a view in a normal direction toward an upper surface 12a of the insulating layer 12, and the planar shape of the object refers to a shape of the object in the plan view in the normal direction toward the upper surface 12a of the insulating layer 12.

The interconnect layer 11 forms a lowermost interconnect layer, and is covered with the insulating layer 12. The interconnect layer 11 includes pads having a planar shape that is a circular shape with a diameter of approximately 150 µm, for example, but may also include an interconnect pattern. An interval between two immediately adjacent pads of the interconnect layer 11, which are immediately next to each other, may be approximately 200 µm, for example. The interconnect layer 11 may be made of a material, such as copper (Cu) or the like, for example. The interconnect layer 11 may have a thickness $T_{11}$ of approximately 10 µm to approximately 20 µm, for example. The interconnect layer 11 functions as external connection terminals (or pads) for making electrical connection to another wiring board, such as a base board or the like.

The insulating layer 12 covers the interconnect layer 11. The insulating layer 12 includes a first layer 121 located the position closer to the interconnect layer 11, and a second layer 122 laminated on the upper surface of the first layer 121.

The first layer 121 is an insulating layer including a non-photosensitive thermosetting resin as a main component thereof, and including no reinforcing material. The insulating layer including the non-sensitive thermosetting resin as the main component thereof means that the insulating layer may include components other than the thermosetting resin, such as a filler or the like. For example, the first layer 121 may include a filler made of silica ($SiO_2$) or the like.

The main component of a material may amount to more than 50 vol %, and may preferably amount to more than 70 vol % in the material.

Examples of the non-photosensitive thermosetting resin used for the first layer 121 include epoxy resins, imide resins, phenol resins, cyanate resin, or the like, for example. The first layer 121 may have a thickness $T_{121}$ of approximately 15 µm to approximately 30 µm, for example. A Coefficient of Thermal Expansion (CTE) of the first layer 121 is higher than the CTE of the second layer 122, and may be approximately 20 ppm/° C. to approximately 30 ppm/° C., for example.

The first layer 121 covers the interconnect layer 11. The first layer 121 may cover only side surfaces of the interconnect layer 11, but preferably covers the upper surface and the side surfaces of the interconnect layer 11. In other words, the thickness $T_{121}$ of the first layer 121 may be smaller than the thickness $T_{11}$ of the interconnect layer 11, but is preferably larger than the thickness $T_{11}$ of the interconnect layer 11. The lower surface of the interconnect layer 11 is exposed at the lower surface of the first layer 121, and the lower surface of the first layer 121 and the lower surface of the interconnect layer 11 may lie on the same plane.

As will be described later, because the second layer 122 includes a reinforcing material 128, the embeddability of the resin is poor. When an attempt is made to embed the interconnect layer into the insulating layer having the poor embeddability, voids may be generated inside the insulating layer. For this reason, it is preferable that the thickness $T_{121}$ of the first layer 121 is larger than the thickness $T_{11}$ of the interconnect layer 11, and that the interconnect layer 11 is embedded into the first layer 121 which includes no reinforcing material. It is possible to reduce the generation of voids by embedding the interconnect layer 11 into the first layer 121 which includes no reinforcing material and has a good embeddability.

The second layer 122 is an insulating layer including a non-photosensitive thermosetting resin as a main component thereof, and including the reinforcing material 128. Hence, the first layer 121 has a high rigidity. The second layer 122 may be formed by impregnating the reinforcing material 128 with the non-photosensitive thermosetting resin. For example, the second layer 122 may include a filler made of silica ($SiO_2$) or the like.

Examples of the non-photosensitive thermosetting resin used for the second layer 122 include epoxy resins, imide resins, phenol resins, cyanate resin, or the like, for example. The second layer 122 may have a thickness $T_{122}$ of approximately 30 µm to approximately 50 µm, for example. The CTE of the second layer 122 is lower than the CTE of the first layer 121, and may be approximately 16 ppm/° C. or lower, for example.

Examples of material used for the reinforcing material 128 include woven fabric, unwoven fabric, or the like made of glass fibers, carbon fibers, aramid fibers, or the like.

The kind and the thickness of the thermosetting resin used for the first layer 121, and the kind and the thickness of the thermosetting resin used for the second layer 122, may be determined independently of each other. In other words, the same thermosetting resin may be used for the first layer 121 and the second layer 122, and different thermosetting resins may be used for the first layer 121 and the second layer 122. In addition, the first layer 121 and the second layer 122 may have the same thickness, or may have different thicknesses. Further, one of the first layer 121 and the second layer 122 may include the filler, or alternatively, both the first layer 121 and the second layer 122 may include the filler. In a case where both the first layer 121 and the second layer 122 include the filler, the kind and content (or amount) of the filler may be the same for the first layer 121 and the second layer 122, or may be different between the first layer 121 and the second layer 122.

The solder layer 21 is formed on the lower surface of the interconnect layer 11. Examples of the material used for the solder layer 21 include SnBi solder or the like, for example. The solder layer 21 may have a thickness of approximately 15 µm to approximately 25 µm, for example. The solder layer 21 is covered by the bonding layer 22 that is formed on a lower surface 12b of the insulating layer 12 (the lower surface of the first layer 121). Examples of the material used for the bonding layer 22 include epoxy insulating resins or the like, for example. The bonding layer 22 may have a thickness of approximately 25 µm to approximately 30 µm, for example. The solder layer 21 and the bonding layer 22 are not essential constituent elements of the wiring board 1, and may be provided if necessary.

The interconnect layer 13 is a via interconnect (or through-hole interconnect) embedded in the insulating layer 12. More particularly, the interconnect layer 13 is a via interconnect filling a via hole 12x, which penetrates the insulating layer 12 (the first layer 121 and the second layer 122) and exposes the upper surface of the interconnect layer 11, to electrically connect to the interconnect layer 11. The via hole 12x may be a cavity having an inverted trapezoidal shape so that the diameter of the opening that opens toward the insulating layer 15 is larger than the diameter of the bottom face of the opening formed by the upper surface of the interconnect layer 11. The diameter of the openings of the via hole 12x may be approximately 60 µm to approximately 70 µm, for example.

The upper surface of the interconnect layer 13 that is the via interconnect, is exposed at the upper surface 12a of the insulating layer 12 (upper surface of the second layer 122). The upper surface of the interconnect layer 13 and the upper surface 12a of the insulating layer 12 may lie on the same plane. The upper surface of the interconnect layer 13 (end face on the side of the second layer 122) is directly connected to the lower surface of the interconnect layer 14. In addition, the lower surface of the interconnect layer 13 (end face on the side of the first layer 121) is directly connected to the interconnect layer 11 inside the insulating layer 12. The material used for the interconnect layer 13 may be similar to the material used for the interconnect layer 11, for example.

In this embodiment, the interconnect layer 13 is made up solely of the via interconnect formed in the via hole 12x of the insulating layer 12. In other words, the interconnect layer 13 does not include an interconnect pattern integrally formed on the upper surface 12a of the insulating layer 12. The interconnect layer 13 and the interconnect layer 14 are electrically connected, but are not integrally formed. More particularly, in a manufacturing method which will be described later, a seed layer is interposed at a boundary between the upper surface of the interconnect layer 13 and the lower surface of the interconnect layer 14 when the interconnect layer 14 is formed by a semi-additive process. Such a structure is used in order to form a high-density interconnect pattern (for example, a line and space L/S of approximately 3 µm/3 µm), as the interconnect layer 14 which will be described later. Details will be described later when describing the method of manufacturing the wiring board 1.

The interconnect layer 14 is formed on the upper layer 12a of the insulating layer 12. The interconnect layer 14 is formed directly on the upper surface 12a of the insulating layer 12, and includes an interconnect (interconnect pattern or pad) that is electrically connected to the interconnect layer 11 through the interconnect layer 13. In other words, a part of the lower surface of the interconnect layer 14 contacts the upper surface of the interconnect layer 13, and the interconnect layer 13 and the interconnect layer 14 are electrically connected to each other. Examples of the material used for the interconnect layer 14 may be copper (Cu) or the like. The interconnect layer 14 may have a multi-layer structure in which a plurality of conductor layers are stacked. The interconnect layer 14 has the interconnect density higher (line and space L/S narrower) than that of the interconnect layer 11, and the interconnect layer 14 is thinner than the interconnect layer 11. In this specification, the interconnect layer having the line and space L/S of 8 µm/8 µm or less will be referred to as an interconnect layer having a high interconnect density. The line and space L/S of the interconnect layer 14 may be approximately 1 µm/1 µm to approximately 3 µm/3 µm, for example. A thickness $T_{14}$ of the interconnect layer 14 may be approximately 1 µm to approximately 3 µm, for example.

The line L of the line and space L/S indicates the width of the interconnect, and the space S of the line and space L/S indicates the spacing between two immediately adjacent interconnects (interval between two interconnects immediately next to each other). Hence, the line and space L/S of 2 µm/2 µm, for example, means that the width of the interconnect is 2 µm, and the spacing between two immediately adjacent interconnects is 2 µm.

The insulating layer 15 is an insulating layer including a photosensitive insulating resin as a main component thereof. The insulating layer including the sensitive insulating resin as the main component thereof means that the insulating layer may include components other than the photosensitive insulating resin, such as a filler or the like. For example, the insulating layer 15 may include a filler made of silica ($SiO_2$) or the like.

The insulating layer 15 is formed on the upper surface 12*a* of the insulating layer 12, to cover the interconnect layer 14. Examples of the photosensitive insulating resin used for the insulating layer 15 include phenol resins, polyimide resins, or the like, for example. The insulating layer 15 may have a thickness of approximately 5 µm to approximately 10 µm, for example.

The interconnect layer 16 is formed on the upper surface of the insulating layer 15, and is electrically connected to the interconnect layer 14. The interconnect layer 16 includes a via interconnect filling the inside of a via hole 15*x* penetrating the insulating layer 15 and exposing the upper surface of the interconnect layer 14, and an interconnect pattern formed on the upper surface of the insulating layer 15. The via hole 15*x* may be a cavity having an inverted trapezoidal shape so that the diameter of the opening that opens toward the insulating layer 17 is larger than the diameter of the bottom face of the opening formed by the upper surface of the interconnect layer 14. The diameter of the openings of the via hole 15*x* may be approximately 10 µm to approximately 20 µm, for example. The material used for the interconnect layer 16, and the thickness of the interconnect pattern forming the interconnect layer 16, may be similar to those of the interconnect layer 14, for example.

The line and space L/S of the interconnect layer 16 may be approximately 1 µm/1 µm to approximately 3 µm/3 µm, for example, but the line and space L/S of the interconnect layer 16 may be narrower than that of the interconnect layer 14. In other words, the upper surface 12*a* of the insulating layer 12 is a polished surface, and is smoother than the lower surface 12*b* of the insulating layer 12. However, the upper surface of the insulating layer 15 including the photosensitive insulating resin as the main component thereof is even smoother than the upper surface 12*a* of the insulating layer 12 including the non-photosensitive thermosetting resin as the main component thereof. For this reason, the line and space L/S of the interconnect layer 16 can be made narrower than the line and space L/S of the interconnect layer 14. For example, the line and space L/S of the interconnect layer 14 may be approximately 3 µm/3 µm, and the line and space L/S of the interconnect layer 16 may be approximately 3 µm/3 µm. The same holds true for the interconnect layers 18 and 20 which will be described later.

The insulating layer 17 is formed on the upper surface of the insulating layer 15, to cover the interconnect layer 16. The material used for the insulating layer 17, and the thickness of the insulating layer 17, may be similar to those of the insulating layer 15, for example. For example, the insulating layer 17 may include a filler made of silica ($SiO_2$) or the like.

The interconnect layer 18 is formed on the upper surface of the insulating layer 17, and is electrically connected to the interconnect layer 16. The interconnect layer 18 includes a via interconnect filling the inside of a via hole 17*x* penetrating the insulating layer 17 and exposing the upper surface of the interconnect layer 16, and an interconnect pattern formed on the upper surface of the insulating layer 17. The via hole 17*x* may be a cavity having an inverted trapezoidal shape so that the diameter of the opening that opens toward the insulating layer 19 is larger than the diameter of the bottom face of the opening formed by the upper surface of the interconnect layer 16. The diameter of the openings of the via hole 17*x* may be approximately 10 µm to approximately 20 µm, for example. The material used for the interconnect layer 18, and the thickness of the interconnect pattern forming the interconnect layer 18, may be similar to those of the interconnect layer 14, for example. The line and space L/S of the interconnect layer 18 may be similar to the line and space L/S of the interconnect layer 16.

The insulating layer 19 is formed on the upper surface of the insulating layer 17, to cover the interconnect layer 18. The material used for the insulating layer 19, and the thickness of the insulating layer 19, may be similar to those of the insulating layer 15, for example. For example, the insulating layer 19 may include a filler made of silica ($SiO_2$) or the like.

The interconnect layer 20 is formed on the upper surface of the insulating layer 19. The interconnect layer 20 includes a via interconnect filling the inside of a via hole 19*x* penetrating the insulating layer 19 and exposing the upper surface of the interconnect layer 18, and a pad projecting from the upper surface of the insulating layer 19. The via hole 19*x* may be a cavity having an inverted trapezoidal shape so that the diameter of the opening that opens toward the pad is larger than the diameter of the bottom face of the opening formed by the upper surface of the interconnect layer 18. The diameter of the openings of the via hole 19*x* may be approximately 10 µm to approximately 20 µm, for example.

The material used for the interconnect layer 20 may be similar to that of the interconnect layer 14, for example. The thickness of the interconnect layer 20 (including the pad projecting from the upper surface of the insulating layer 19) may be approximately 10 µm, for example. The pads forming the interconnect layer 20 may have a planar shape that is a circular shape with a diameter of approximately 20 µm to approximately 30 µm, for example. The pads forming the interconnect layer 20 may be arranged at an interval (or pitch) of approximately 40 µm to approximately 40 µm, for example. The pads forming the interconnect layer 20 may be used to make an electrical connection to an electronic component, such as a semiconductor chip or the like.

A surface-treated layer (not illustrated) may be formed on the surface (only on the upper surface, or on both the upper surface and the side surfaces) of the pads forming the interconnect layer 20, by performing a surface treatment. Examples of the surface-treated layer include a Au layer, Ni/Au layer (metal multi-layer having the Ni layer and the Au layer stacked in this order), Ni/Pd/Au layer (metal multi-layer having the Ni layer, the Pd layer, and the Au layer stacked in this order), or the like, for example. In addition, the surface-treated layer may be formed on the surface (only on the upper surface, or on both the upper surface and the side surfaces) of the pads forming the interconnect layer 20, by performing an anti-oxidant treatment such as an Organic Solderability Preservative (OSP) treatment or the like, for example.

The CTE of each insulating layer may be adjusted to a predetermined value by adjusting the content of the filler, the composition of the insulating resin, or the like, for example. However, in the case of the insulating layer including the photosensitive resin as the main component thereof, there is a limit (upper limit) to the filler content that may be included, because the exposure becomes difficult or impossible when the filler content becomes excessively large. Accordingly, the CTE of the insulating layer including the photosensitive resin as the main component thereof tends to become larger than the CTE of the insulating layer including the non-photosensitive thermosetting resin as the main component thereof. Examples of the filler, other than the silica ($SiO_2$) described above, include kaolin ($Al_2Si_2O_5(OH)_4$), talc ($Mg_3Si_4O_{10}(OH)_2$), alumina ($Al_2O_3$), or the like, for example. Further, the filler may include a mixture of two or more such filler materials.

[Method of Manufacturing Wiring Board According to First Embodiment]

Next, a method of manufacturing the wiring board according to the first embodiment will be described. FIG. 2A through FIG. 7C are diagrams for explaining manufacturing processes of the wiring board according to the first embodiment. Although the processes of manufacturing one wiring board are described in the following, it is of course possible to form a plurality of parts respectively corresponding to the wiring board, and thereafter cut the plurality of parts into individual pieces respectively becoming the wiring board.

Figure 2A:
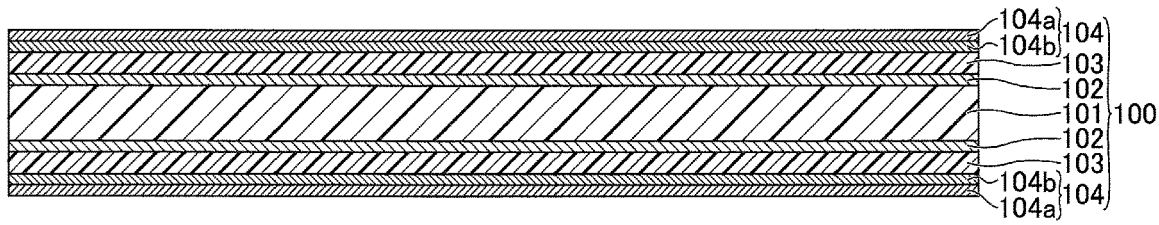
FIG. 2A, FIG. 2B, FIG. 2C, and FIG. 2D are diagrams for explaining manufacturing processes of the wiring board according to the first embodiment.

First, in the process illustrated in FIG. 2A, a support 100 is prepared. The support 100 has a structure including a core base material 101, and a copper film 102, a pre-impregnated layer 103, and a copper film 104 with carrier. The copper film 102 is formed on both the upper and lower surfaces of the core base material 101, for example. The pre-impregnated layer 103 and the copper film 104 with carrier are successively laminated on each copper film 102. The core base material 101 is a glass epoxy base having a thickness of approximately 0.7 mm, for example, and the copper film 102 has a thickness of approximately 7 μm to approximately 50 μm, for example. The pre-impregnated layer 103 includes woven fabric, unwoven fabric, or the like made of glass fibers, carbon fibers, aramid fibers, or the like, impregnated with a thermosetting epoxy resin, polyimide resin, or the like, for example.

The copper film 104 with carrier has a structure including a thick film (carrier film) 104b made of copper and having a thickness of approximately 10 μm to approximately 50 μm, for example, and a thin film 104a made of copper and having a thickness of approximately 1.5 μm to approximately 5 μm, for example. The thin film 104a is adhered on the thick film 104b via a peel layer (not illustrated), in a peelable state with respect to the thick film 104b. The thick film 104b is provided as a support member for facilitating the handling of the thin film 104a. The thick film 104b is adhered to the copper film 102 of the core base material 101, via the pre-impregnated layer 103. The thin film 104a is arranged at the outermost layer on both the upper and lower surfaces of the support 100.

This structure of the support 100 is merely an example, and the support 100 is not particularly limited to the structure described above. For example, the core base material 101 of the support 100 may be replaced by a multi-layer structure in which a plurality of pre-impregnated layers 103 are laminated. In addition, the support 100 may have a structure in which the copper film 104 with carrier is arranged on both upper and lower surfaces of a glass base, a metal base, or the like via the peel layer.

Figure 2B:
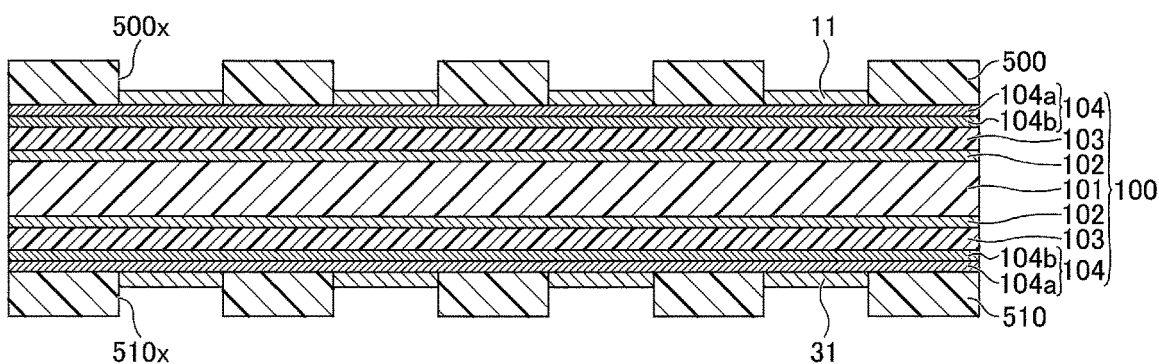

Next, in the process illustrated in FIG. 2B, a photosensitive resist layer 500 is formed on the entire upper surface of the upper copper film 104 with carrier (upper surface of the thin film 104a), and the resist layer 500 is exposed and developed, to form openings 500c that expose parts where the interconnect layer 11 is to be formed. Similarly, a photosensitive resist layer 510 is formed on the entire lower surface of the lower copper film 104 with carrier (lower surface of the thin film 104a), and the resist layer 510 is exposed and developed, to form openings 510x that expose parts where the interconnect layer 31 is to be formed. For example, a dry film resist may be used for the resist layers 500 and 510. The openings 500x and the openings 510x are formed at positions opposing each other via the support 100. An electroplated layer is formed on the upper surface the upper copper film 104 with carrier, exposed within the openings 500x, by electroplating using the upper copper film 104 with carrier as a feeder layer, to form the interconnect layer 11. Similarly, an electroplated layer is formed on the lower surface of the lower copper film 104 with carrier, exposed within the openings 510x, by electroplating using the lower copper film 104 with carrier as the feeder layer, to form the interconnect layer 31. The material and the thickness of the interconnect layer 11 may be the same as those described above. The material and the thickness of the interconnect layer 31 may be similar to those of the interconnect layer 11.

Figure 2C:
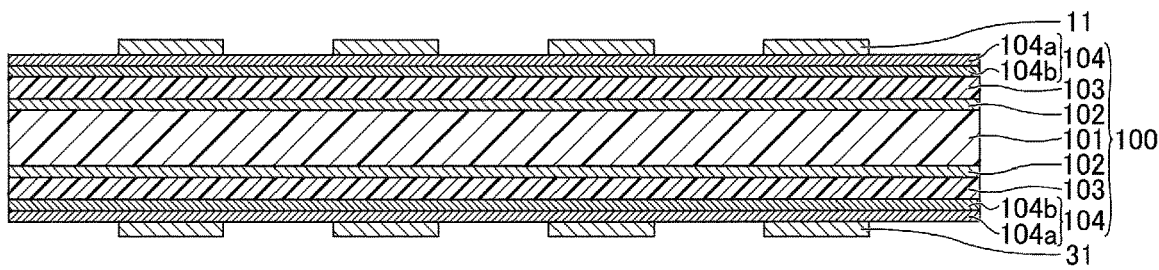

Next, in the process illustrated in FIG. 2C, the resist layers 500 and 510 are peeled off. Next, in the process illustrated in FIG. 2D, a photosensitive resist layer 520 is famed on the entire upper surface of the upper copper film 104 with carrier, to cover the interconnect layer 11, and a photosensitive resist layer 530 is formed on the entire lower surface of the lower copper film 104 with carrier, to cover the interconnect layer 31. For example, a dry film resist may be used for the resist layers 520 and 530. The resist layer 520 is exposed and developed, to form openings 520x that expose outer peripheral parts of the upper copper film 104 with carrier. In addition, the resist layer 530 is exposed and developed, to form openings 530x that expose outer peripheral parts of the lower copper film 104 with carrier. The openings 520x and the openings 530x are formed at positions opposing each other via the support 100.

Figure 2D:
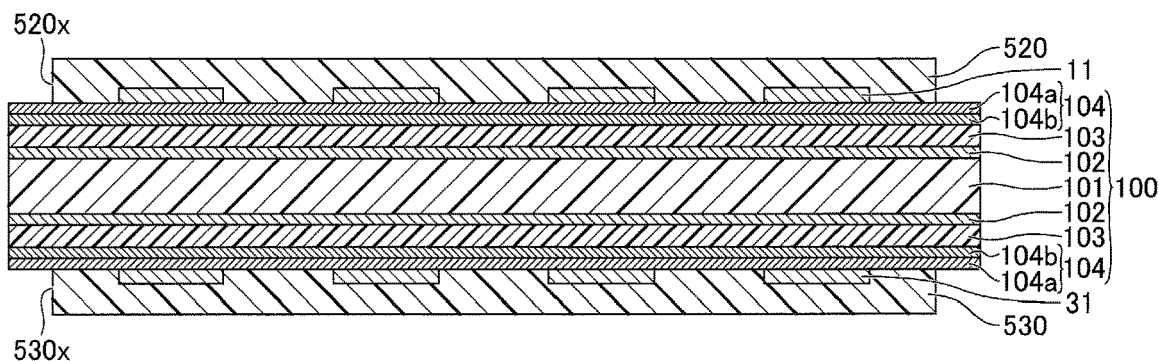
Figure 3A:
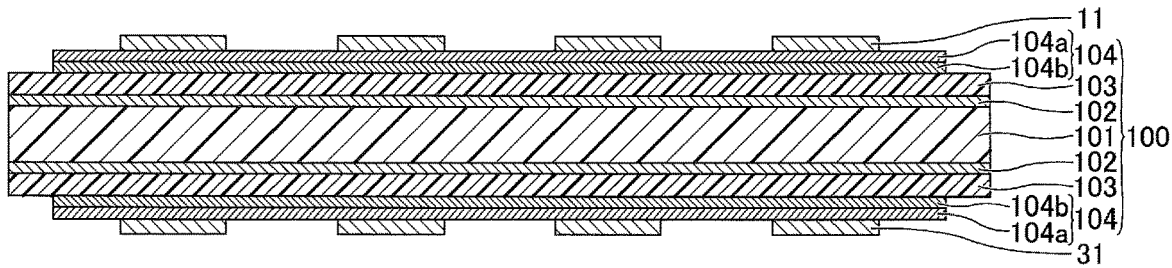
FIG. 3A, FIG. 3B, and FIG. 3C are diagrams for explaining the manufacturing processes of the wiring board according to the first embodiment.

Next, in the process illustrated in FIG. 3A, the upper copper film 104 with carrier, exposed within the openings 520x illustrated in FIG. 2D, and the lower copper film 104 with carrier, exposed within the openings 530x illustrated in FIG. 2D, are removed by etching. Hence, the upper surface of the upper pre-impregnated layer 103 is exposed at the outer peripheral parts of the upper surface of the support 100, and the lower surface of the lower pre-impregnated layer 103 is exposed at the outer peripheral parts of the lower surface of the support 100. Thereafter, the resist layers 520 and 530 are removed. The pre-impregnated layer 103 is exposed at the outer peripheral parts of the upper and lower surfaces of the support 100, in order to provide regions in which the upper pre-impregnated layer 103 directly contacts the insulating layer 12 without interposing the copper film 104 with carrier and improve the adhesion between the upper pre-impregnated layer 103 and the insulating layer 12, and to provide regions in which the lower pre-impregnated layer 103 directly contacts the insulating layer 32 without interposing the copper film 104 with the carrier, and improve the adhesion between the lower pre-impregnated layer 103 and the insulating layer 32.

Figure 3B:
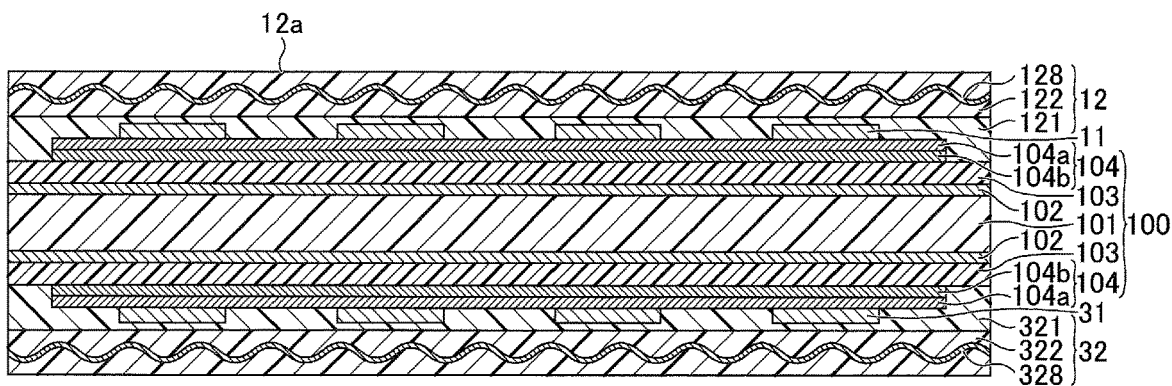

Next, in the process illustrated in FIG. 3B, the insulating layer 12, which covers the upper copper film 104 with carrier and the interconnect layer 11, is formed on the upper surface of the upper pre-impregnated layer 103. In addition, the insulating layer 32, which covers the lower copper film 104 with carrier and the interconnect layer 31, is formed on the lower surface of the lower pre-impregnated layer 103.

More particularly, an insulating resin film in a semi-cured state, including the non-photosensitive thermosetting resin as the main component thereof and including no reinforcing material, for example, is prepared. This insulating resin film is laminated on the upper surface of the upper pre-impregnated layer 103, to cover the upper copper film 104 with carrier and the interconnect layer 11, and is cured while applying heat and pressure, to form the first layer 121.

Next, an insulating resin film in a semi-cured state, including the non-photosensitive thermosetting resin as the main component thereof and including the reinforcing material 128, for example, is prepared. This insulating resin film is laminated on the upper surface of the first layer 121, and is cured while applying heat and pressure, to form the second layer 122. Hence, the insulating layer 12 in which the second layer 122 is laminated on the first layer 121, is formed. The material, the thickness, the CTE, or the like of the first layer 121 and the second layer 122 are the same as those described above.

Similarly, the insulating layer 32 in which a second layer 322 is laminated on a first layer 321, is formed on the lower surface of the lower pre-impregnated layer 103. The material, the thickness, the CTE, or the like of the first layer 321 and the second layer 322 may be similar to those of the first layer 121 and the second layer 122.

The processes described above are merely examples. For example, it is possible to use a multi-layer film that is obtained by laminating a non-photosensitive insulating resin film in a semi-cured state, including the non-photosensitive thermosetting resin as the main component thereof and including the reinforcing material 128, on a non-photosensitive insulating resin film in a semi-cured state, including the non-photosensitive thermosetting resin as the main component thereof and including no reinforcing material. In this case, this multi-layer film in the semi-cured state is laminated on the upper surface of the upper pre-impregnated layer 103, to cover the upper copper film 104 with carrier and the interconnect layer 11, and is cured while applying heat and pressure, to form the insulating layer 12 in which the second layer 122 is laminated on the first layer 121. The insulating layer 32 may also be formed by a similar multi-layer film.

Figure 3C:
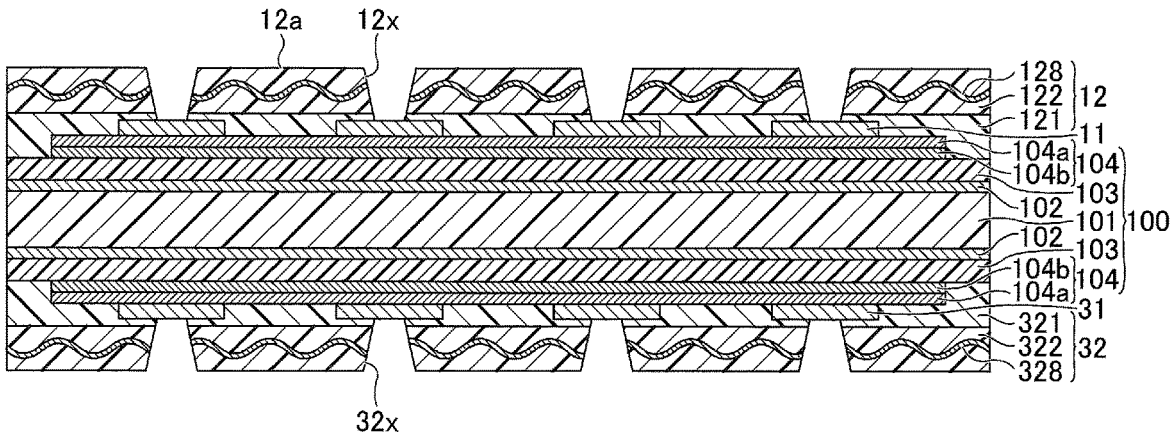

Next, in the process illustrated in FIG. 3C, via holes 12x, penetrating the insulating layer 12 and exposing the upper surface of the interconnect layer 11, are famed in the insulating layer 12. Similarly, via holes 32x, penetrating the insulating layer 32 and exposing the lower surface of the interconnect layer 31, are formed in the insulating layer 32. The via holes 12x and 32x may be famed by laser beam machining, using $CO_2$ laser, Yttrium Aluminum Garnet (YAG) laser, excimer laser, or the like, for example. A desmear process is preferably performed after forming the via holes 12x and 32x, to remove the residual resin adhered on the surfaces of the interconnect layers 11 and 32 exposed at the bottom faces of the via holes 12x and 32x.

Figure 4A:
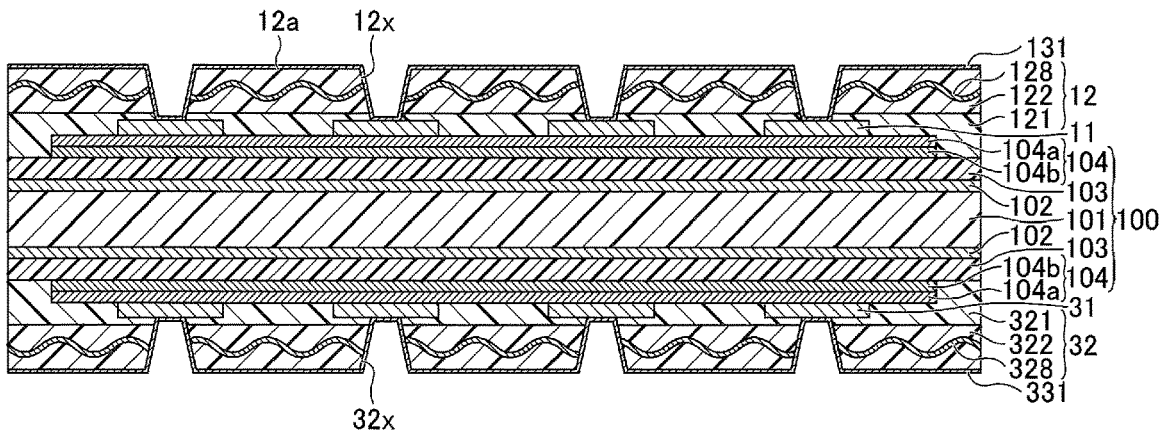
FIG. 4A, FIG. 4B, and FIG. 4C are diagrams for explaining the manufacturing processes of the wiring board according to the first embodiment.
Figure 4B:
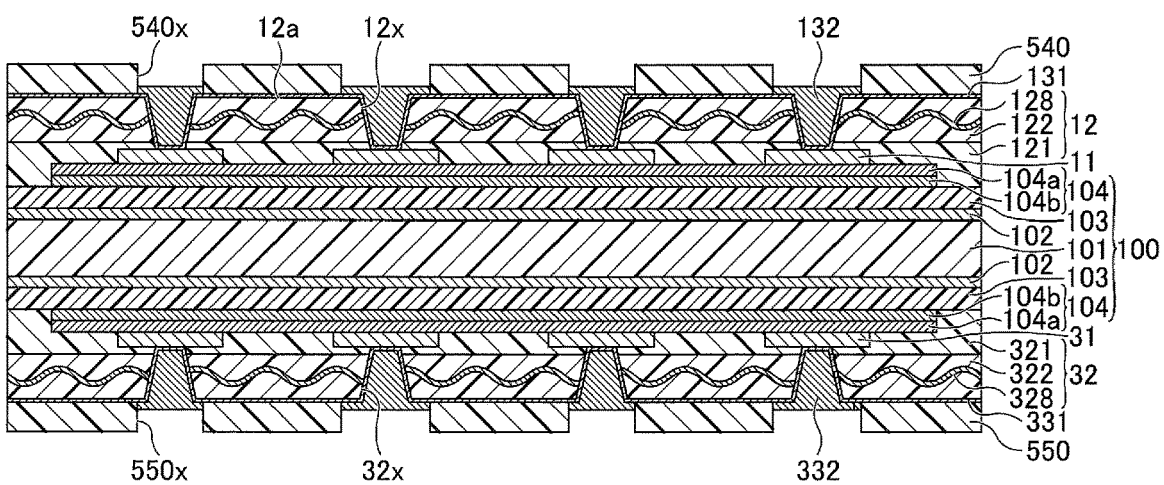
Figure 4C:
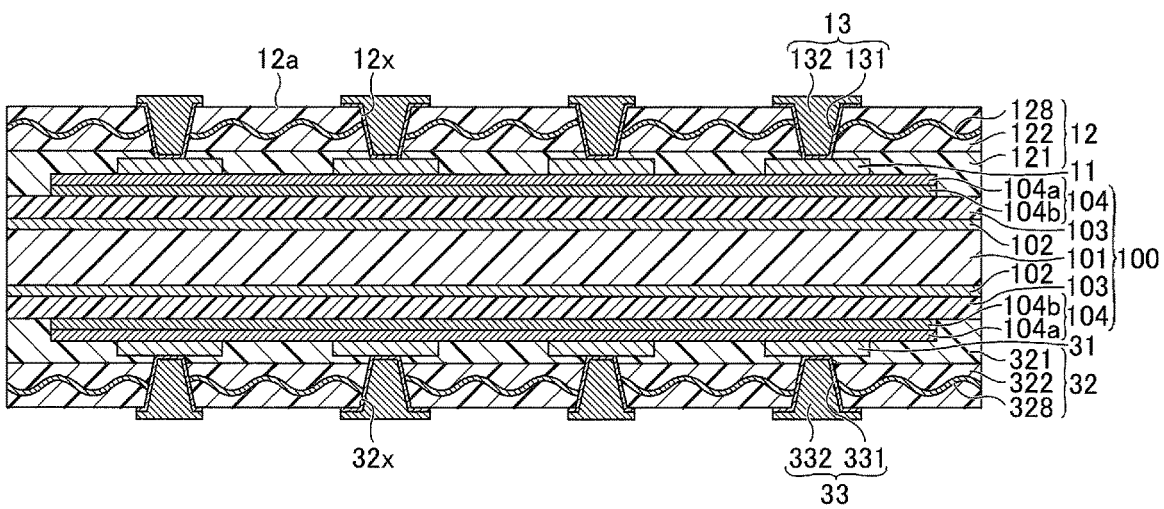

Next, in the processes illustrated in FIG. 4A through FIG. 4C, the interconnect layers 13 and 33 are formed. The interconnect layers 13 and 33 may be formed using the semi-additive process, for example. More particularly, first, as illustrated in FIG. 4A, a seed layer 131 is formed on the surface of the insulating layer 12 including the inner wall of the via holes 12x, and the surface of the interconnect layer 11 exposed within the via holes 12x, using the electroless plating, sputtering, or the like. Similarly, a seed layer 331 is formed on the surface of the insulating layer 32 including the inner wall of the via holes 32x, and the surface of the interconnect layer 33 exposed within the via holes 32x, using the electroless plating, sputtering, or the like. For example, a copper layer having a thickness of approximately 100 nm to approximately 350 nm may be used for the seed layers 131 and 331. In addition, a multi-layer structure in which a titanium layer having a thickness of approximately 20 nm to 50 nm is stacked on a copper layer having a thickness of approximately 100 nm to 300 nm, may be used for the seed layers 131 and 331. By forming the titanium layer as the lower layer of the seed layers 131 and 331 having the multi-layer structure, it is possible to improve the adhesion between the insulating layer 12 and the interconnect layer 13, and the adhesion between the insulating layer 32 and the interconnect layer 33. Of course, titanium nitrides or the like may be used in place of titanium. Titanium and titanium nitrides are metals having a corrosion resistance higher than that of copper.

Next, as illustrated in FIG. 4B, a photosensitive resist layer 540 is formed on the entire upper surface of the seed layer 131, and the resist layer 540 is exposed and developed, to form openings 540x that expose parts where the interconnect layer 13 is to be formed. Similarly, a photosensitive resist layer 550 is formed on the entire lower surface of the seed layer 331, and the resist layer 550 is exposed and developed, to form openings 550x that expose parts where the interconnect layer 33 is to be formed. For example, a dry film resist may be used for the resist layers 540 and 550. The openings 540x and the openings 550x are formed at positions opposing each other via the support 100. An electroplated layer 132, which is a copper layer, for example, is formed on the upper surface the seed layer 131 exposed within the openings 540x, by electroplating using the seed layer 131 as the feeder layer. Similarly, an electroplated layer 332, which is a copper layer, for example, is formed on the lower surface of the seed layer 331 exposed within the openings 550x, by electroplating using the seed layer 331 as the feeder layer.

Next, as illustrated in FIG. 4C, after removing the resist layer 540, the electroplated layer 132 is used as a mask, to remove parts of the seed layer 131 not covered by the electroplated layer 132 by etching. Hence, the interconnect layer 13, including the electroplated layer 132 on the seed layer 131, is formed. Similarly, after removing the resist layer 550, the electroplated layer 332 is used as a mask, to remove parts of the seed layer 331 not covered by the electroplated layer 332 by etching. Hence, the interconnect layer 33, including the electroplated layer 332 on the seed layer 331, is formed.

By the processes described above, a layer structure, including the insulating layers and the interconnect layers arranged in vertical symmetry (that is, symmetric in up and down directions) with respect to the support 100 which is regarded as the center, is formed. This layer structure having the vertical symmetry enables physical properties, such as elasticity modulus and CTE, to be balanced along the vertical direction (up and down directions) of the support 100. As a result, it is possible to reduce the generation of warp in the structure during the manufacturing processes of the wiring board 1. The lower layer structure of the wiring board 1 does not need to be manufactured as the wiring board 1. However, the lower layer structure of the wiring board 1 may be manufactured and completed as the wiring board 1. In addition, when the warp of the structure during the manufacturing processes of the wiring board 1 does not introduce problems, the layer structure on the lower surface of the support 100 may be omitted.

Figure 5A:
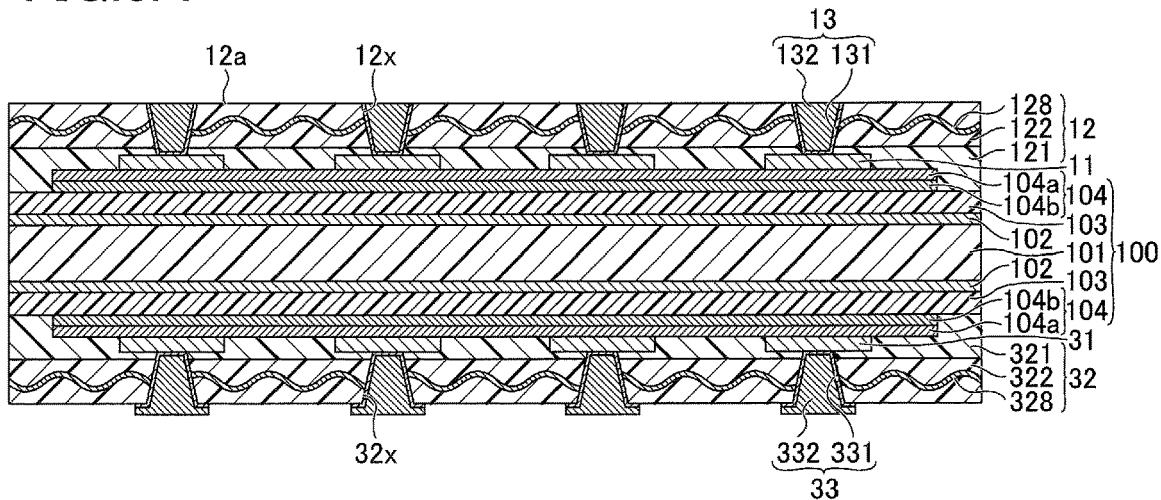
FIG. 5A, FIG. 5B, and FIG. 5C are diagrams for explaining the manufacturing processes of the wiring board according to the first embodiment.

Next, in the process illustrated in FIG. 5A, the upper surface of the interconnect layer 13 is polished, to expose the upper surface 12a of the insulating layer 12 and the upper surface of the interconnect layer 13 filling the inside of the via hole 12x, and form the interconnect layer 13 which is the via interconnect filling the inside of the via hole 12x. The interconnect layer 13 may be polished using Chemical Mechanical Polishing (CME) or the like, for example. The upper surface of the interconnect layer 13 may lie on the same plane as the upper surface 12a of the insulating layer 12, for example.

When polishing the interconnect layer 13, a part of the upper surface 12a of the insulating layer 12 may be polished and removed simultaneously as the polishing of the interconnect layer 13. By polishing the upper surface 12a of the insulating layer 12 together with the interconnect layer 13, a part of the upper surface 12a of the insulating layer 12 may be removed, to reduce the roughness of the upper layer 12a of the insulating layer 12 compared to the roughness before the polishing. In other words, it is possible to improve the smoothness of the upper layer 12a of the insulating layer 12. A surface roughness Ra of the upper surface 12a of the insulating layer 12 before performing the polishing using the CMP is approximately 300 nm to approximately 400 nm, and the surface roughness Ra can be reduced to approximately 15 nm to approximately 40 nm by performing the CMP. When the roughness of the upper surface 12a of the insulating layer 12 is reduced to improve the smoothness, a micro interconnect structure (or an interconnect layer having a high interconnect density) can be formed at a latter process. The surface roughness Ra of the lower surface 12b of the insulating layer 12 may be approximately 180 nm to approximately 280 nm, for example.

Figure 5B:
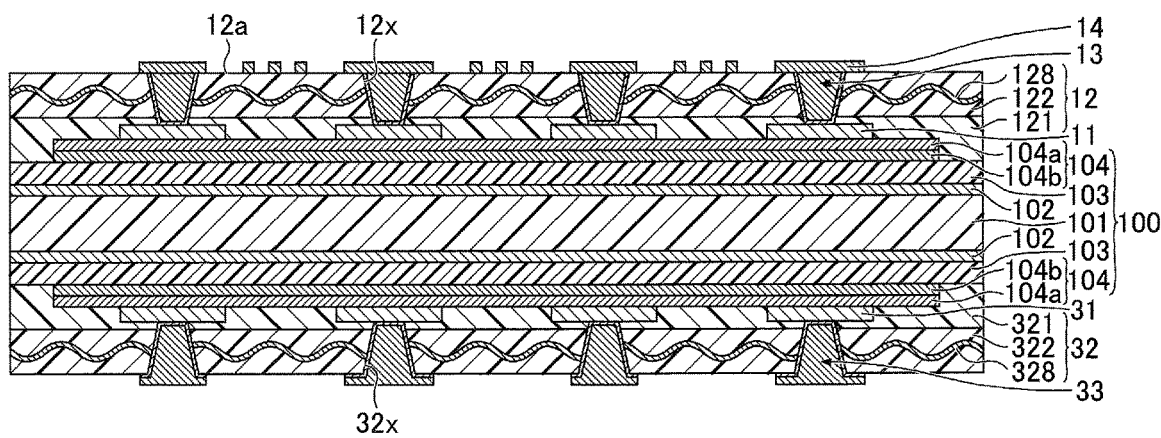

Next, in the process illustrated in FIG. 5B, the interconnect layer 14 is formed. The interconnect layer 14 may be formed by the semi-additive process, for example, similar to the interconnect layers 13 and 33. More particularly, first, a seed layer is formed by electroless plating, sputtering, or the like, to continuously cover the upper surface of the interconnect layer 13 and the upper surface 12a of the insulating layer 12. Although the electroless plating may be used to form the seed layer, a thinner seed layer can be formed using the sputtering. Hence, from a viewpoint of increasing the interconnect density of the interconnect layer, the sputtering is more advantageous and preferably used to form the seed layer.

Then, a photosensitive resist layer is formed on the entire upper surface of the seed layer, and the resist layer is exposed and developed, to form openings that expose parts where the interconnect layer 14 is to be formed. An electroplated layer is formed on the upper surface the seed layer exposed within the openings, by electroplating using the seed layer as the feeder layer. After removing the resist layer, the electroplated layer is used as a mask, to remove parts of the seed layer not covered by the electroplated layer by etching. Hence, the interconnect layer 14, including the electroplated layer on the seed layer, is formed. The material, thickness, line and space L/S, or the like of the interconnect layer 14 may be the same as those described above. The interconnect layer 14 has the multi-layer structure in which the electroplated layer is stacked on the seed layer. However, in FIG. 5B or the like, distinguishable illustration of the seed layer and the electroplated layer, forming the interconnect layer 14, will be omitted. Further, the distinguishable illustration of other interconnect layers may be similarly omitted.

Figure 5C:
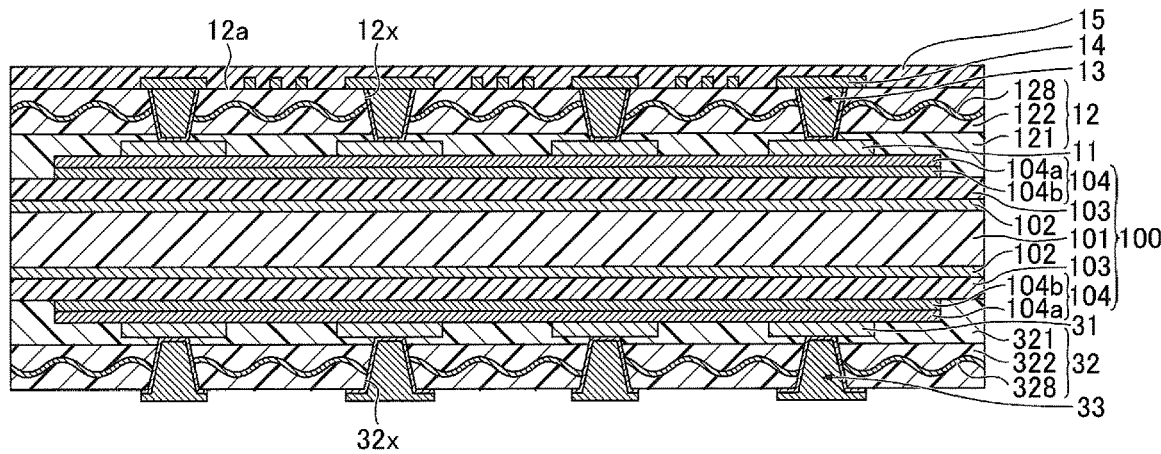

Next, in the process illustrated in FIG. 5C, a photosensitive insulating resin in liquid form or paste form is coated on the upper surface 12a of the insulating layer 12, to cover the interconnect layer 14, and the insulating layer 15 in a semi-cured state is formed by heating to a temperature that does not cause complete curing. The material and the thickness of the insulating layer 15 may be the same as those described above.

Figure 6A:
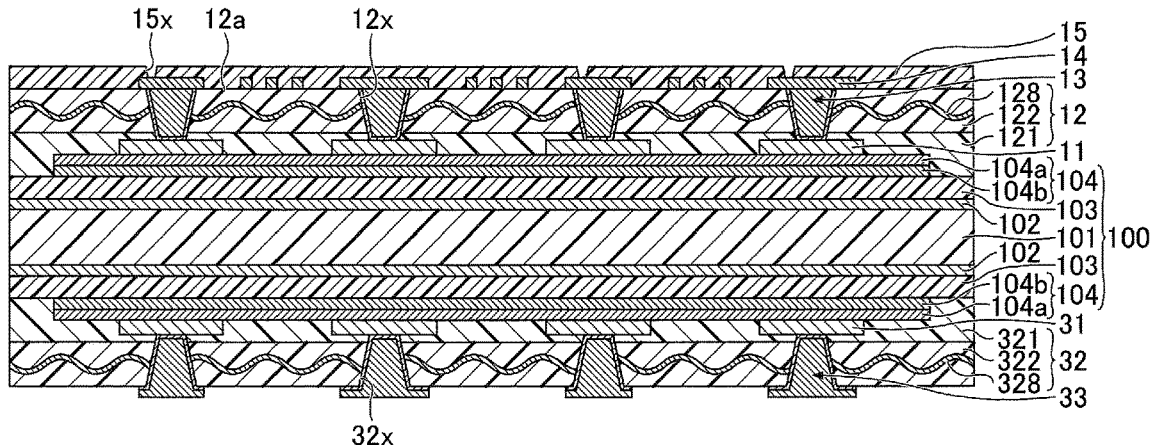
FIG. 6A, FIG. 6B, and FIG. 6C are diagrams for explaining the manufacturing processes of the wiring board according to the first embodiment.

Next, in the process illustrated in FIG. 6A, via holes 15x are formed in the insulating layer 15 by photolithography, for example, and the insulating layer 15 is thereafter heated to the curing temperature or higher to cure the insulating layer 15. The upper surface of the insulating layer 15 including the photosensitive insulating resin as the main component thereof becomes even smoother than the upper surface 12a of the insulating layer 12. The surface roughness Ra of the upper surface of the insulating layer 15 may be approximately 2 nm to approximately 6 nm, for example.

Figure 6B:
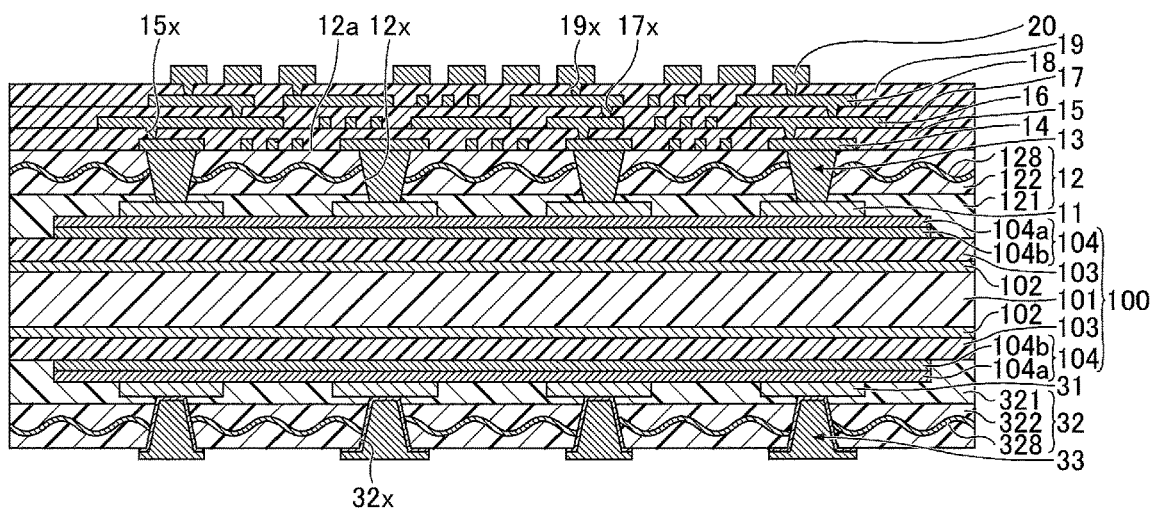

Next, in the process illustrated in FIG. 6B, processes similar to the processes illustrated in FIG. 5B through FIG. 6A are repeated to form the interconnect layer 16, the insulating layer 17, the interconnect layer 18, and the insulating layer 19. Thereafter, the interconnect layer 20 is formed by a process similar to the process illustrated in FIG. 5B. The material and the thickness of each of the interconnect layer 16, the insulating layer 17, the interconnect layer 18, the insulating layer 19, and the interconnect layer 20 may be the same as those described above. The surface-treated layer described above may be formed on the surface (only on the upper surface, or on both the upper surface and the side surfaces) of the pads forming the interconnect layer 20, if necessary.

Figure 6C:
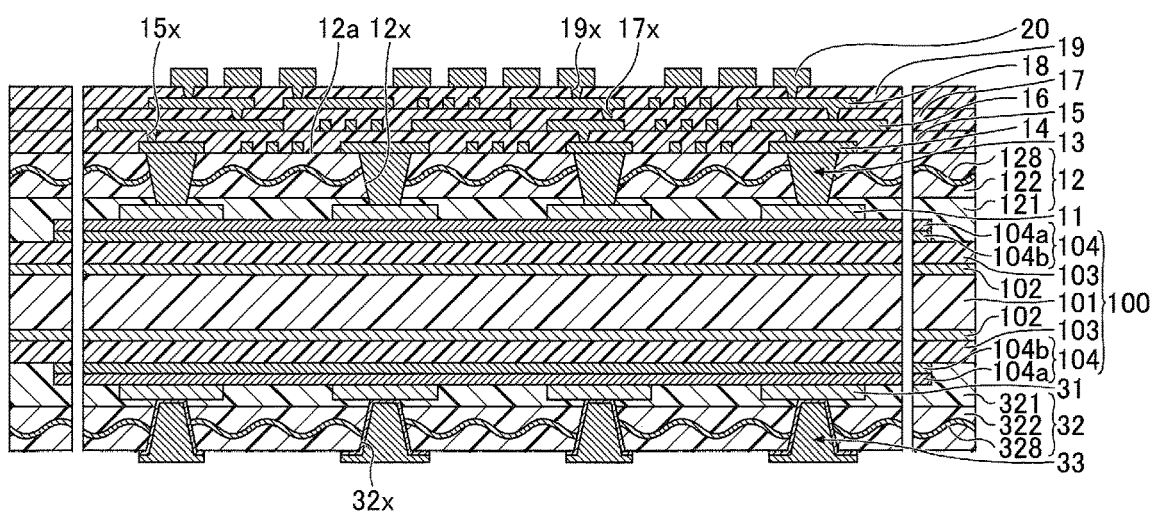
Figure 7A:
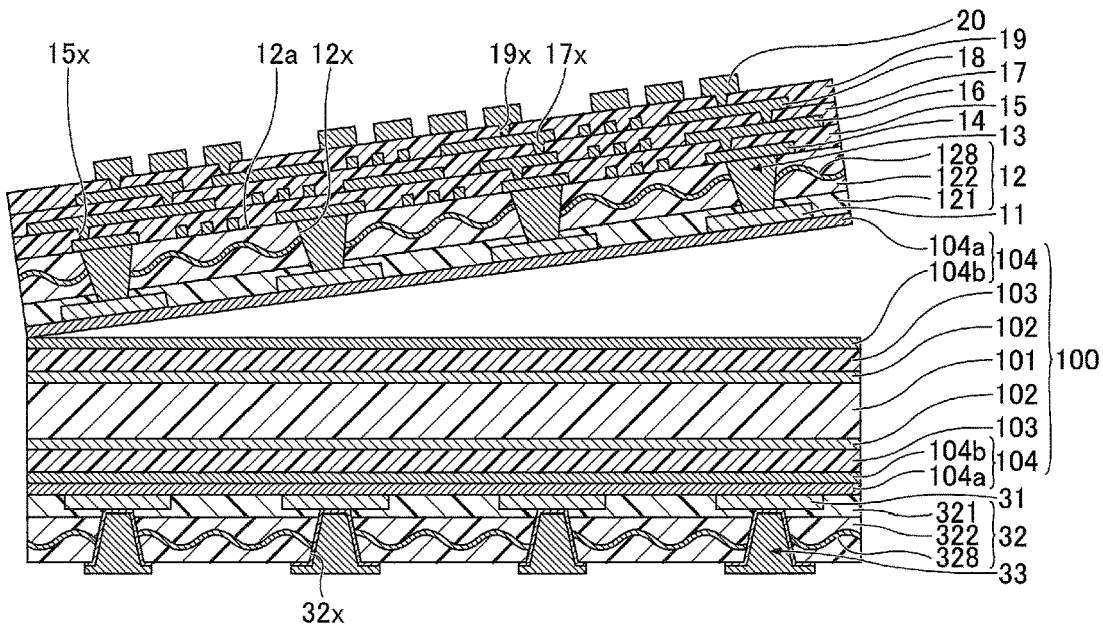
FIG. 7A, FIG. 7B, and FIG. 7C are diagrams for explaining the manufacturing processes of the wiring board according to the first embodiment.

Next, in the process illustrated in FIG. 6C, the outer peripheral part of the structure illustrated in FIG. 6B is cut using a dicing blade or the like. The cutting is performed to remove the regions where the insulating layer 12 and the upper pre-impregnated layer 103 make direct contact, and the regions where the insulating layer 32 and the lower pre-impregnated layer 103 make direct contact. Hence, as illustrated in FIG. 7A, parts where the thick film 104b and the thin film 104a connect, can easily be separated. In other words, it is possible to easily remove the main part of the support 100.

Figure 7B:
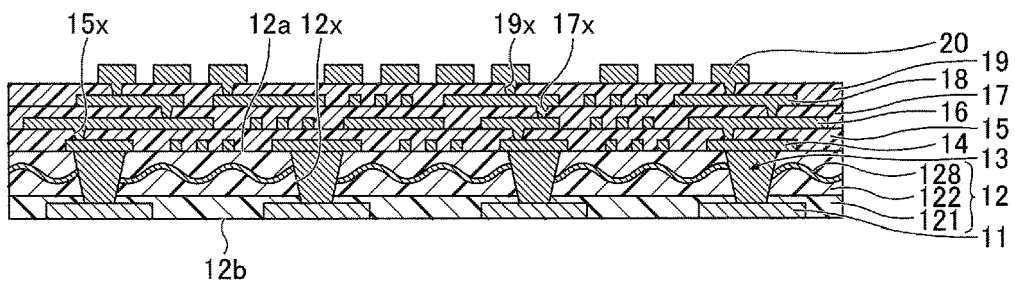

Next, in the process illustrated in FIG. 7B, the thin film 104a is removed from the structure, illustrated in a tilted orientation in FIG. 7A, and already removed of the main part of the support 100 illustrated in FIG. 7A. The thin film 104a may be removed by wet etching, for example. Accordingly, the lower surface of the interconnect layer 11 becomes exposed at the lower surface 12b of the insulating layer 12. The lower surface 12b of the insulating layer 12 may lie on the same plane as the lower surface of the interconnect layer 11, for example.

Figure 7C:
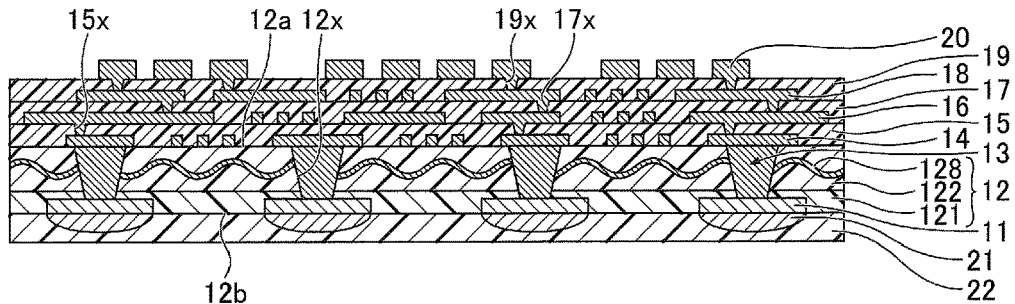

Next, in the process illustrated in FIG. 7C, the solder layer 21 is formed on the lower surface of the interconnect layer 11 by screen printing or the like. The material and the thickness of the solder layer 21 may be the same as those described above. The bonding layer 22, which covers the solder layer 21, is formed on the lower surface 12b of the insulating layer 12. The bonding layer 22 may be formed by laminating an insulating thermosetting resin film called a Non-Conductive Film (NCF) on the lower surface 12b of the insulating layer 12, to cover the solder layer 21, and heating the NFC to cure the NCF. The wiring board 1 is completed by performing the processes described above. The solder layer 21 and the bonding layer 22 are not essential constituent elements of the wiring board 1n and may be formed if necessary, such as immediately before mounting the wiring board 1 on the base board, for example.

The wiring board 1 includes the interconnect layer 11, and the interconnect layer 14, thinner than the interconnect layer 11 and having the interconnect density higher than that of the interconnect layer 11. In addition, the insulating layer 12 under the interconnect layer 14 includes the first layer 121 arranged on the side closer to the interconnect layer 11 and including no reinforcing material, and the second layer 122 laminated on the first layer 121 and including the reinforcing material 128. Further, each of the first layer 121 and the second layer 122 includes the non-photosensitive thermosetting resin as the main component thereof, and the CTE of the first layer 121 is higher than the CTE of the second layer 122.

Because the wiring board 1 includes the second layer 122 including the reinforcing material 128, it is possible to increase the rigidity of the wiring board 1.

A wiring board 1X according to a comparison example will be described. The wiring board 1X is not provided with the first layer 121, but is otherwise the same as the wiring board 1. When heat is applied to the wiring board 1X and the wiring board 1X is thereafter returned to room temperature, the second side of the wiring board 1X closer to the interconnect layer 11 tends to warp in a downward convex (hereinafter also referred to as "downwardly convex warp"). For example, the wiring board 1X tends to warp after the main part of the support 100 is removed as illustrated in FIG. 7A. However, because the wiring board 1 is provided with the first layer 121, under the second layer 122 and having the CTE higher than that of the second layer 122, the first layer 121 contracts more than the second layer 122 when heat is applied to the wiring board 1 and the wiring board 1 is thereafter returned to room temperature. Since the first layer 121 contracts more than the second layer 122, a force acts in a direction opposite to, that is, in a direction to reduce or cancel the downwardly convex warp on the second side of the wiring board 1 closer to the interconnect layer 11. For this reason, even after the support 100 is removed, it is possible to reduce the warp of the wiring board 1.

Further, because the first layer 121 includes no reinforcing material in the resin, it is possible to prevent the embeddability of the resin from deteriorating when embedding the interconnect layer 11 into the resin.

First Modification of First Embodiment

In a first modification of the first embodiment, the layer structure of the insulating layer covering the interconnect layer 11 is different from that of the first embodiment. In the first modification of the first embodiment, those parts that are the same as those corresponding part of the first embodiment are designated by the same reference numerals, and a description thereof may be omitted.

Figure 8:
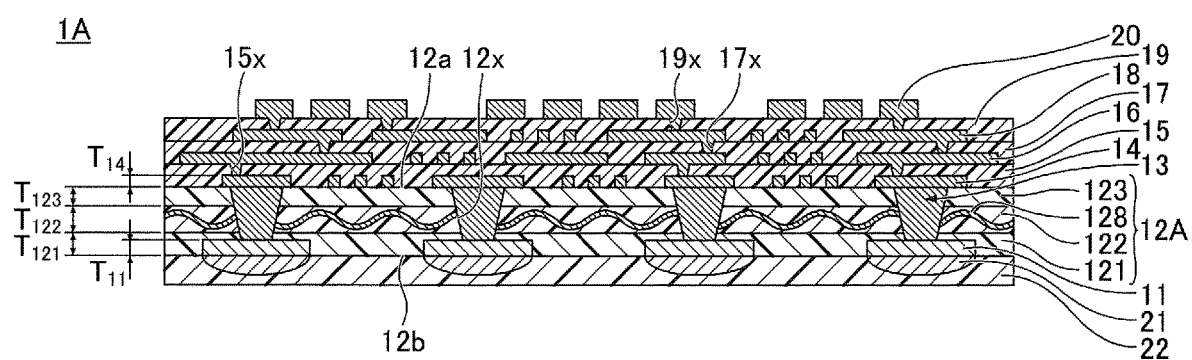
FIG. 8 is a cross sectional view illustrating an example of the wiring board according to a first modification of the first embodiment.

FIG. 8 is a cross sectional view illustrating an example of the wiring board according to the first modification of the first embodiment. As illustrated in FIG. 8, a wiring board 1A differs from the wiring board 1 illustrated in FIG. 1, in that the wiring board 1A includes an insulating layer 12A in place of the insulating layer 12.

The insulating layer 12A includes the first layer 121, the second layer 122 laminated on the upper surface of the first layer 121, and a third layer 123 laminated on the upper surface of the second layer 122. The third layer 123 includes a non-photosensitive thermosetting resin as a main component thereof, and includes no reinforcing material, similar to the first layer 121. However, the third layer 123 has a rigidity lower than the rigidity of the first layer 121.

The non-photosensitive thermosetting resin used for the third layer 123 may be appropriately selected from the above mentioned examples of the non-photosensitive thermosetting resin used for the first layer 121, for example. When the same thermosetting resin is used as the main component of the first layer 121 and the third layer 123, the rigidity of the third layer 123 can be made lower than the rigidity of the first layer 121 by making a thickness $T_{123}$ of the third layer 123 smaller than the thickness $T_{121}$ of the first layer 121. The rigidity of the third layer 123 can be made lower than the rigidity of the first layer 121 by forming the first layer 121 and the third layer 123 from different materials, and appropriately adjusting the thickness relationship between the first layer 121 and the third layer 123.

When forming the insulating layer 12A, processes similar to the processes described above in conjunction with FIG. 2A through FIG. 3A are performed, for example, and thereafter, an insulating resin film in a semi-cured state, including the non-photosensitive thermosetting resin as the main component thereof and including no reinforcing material, is prepared in a process illustrated in FIG. 3B. Then, after laminating the second layer 122 on the first layer 121, this insulating resin film is laminated on the upper surface of the second layer 122 and cured while applying heat and pressure, to form the third layer 123. Further, after performing processes similar to the process described above in conjunction FIG. 3C through FIG. 4C, the upper surface of the third layer 123 of the insulating layer 12 is polished simultaneously as the polishing of the upper surface of the interconnect layer 13 in the process illustrated in FIG. 5A, to form the third layer 123 to a desired thickness. When polishing the upper surface of the interconnect layer 13, the upper surface of the third layer 123 of the insulating layer may be polished simultaneously to completely remove the third layer 123, in order to form the insulating layer 12 according to the first embodiment.

In the process illustrated in FIG. 3B, it is possible to use a multi-layer film that is obtained by successively laminating an insulating resin film in a semi-cured state, including a non-photosensitive thermosetting resin and no reinforcing material, an insulating resin film in a semi-cured state, including the non-photosensitive thermosetting resin as the main component thereof and including the reinforcing material 128, and an insulating resin film in a semi-cured state, including a non-photosensitive thermosetting resin as the main component thereof and including no reinforcing material. In this case, this multi-layer film in the semi-cured state is laminated on the upper surface of the upper pre-impregnated layer 103, to cover the upper copper film 104 with carrier and the interconnect layer 11. Further, this multi-layer film in the semi-cured state is cured while applying heat and pressure, to form the insulating layer 12A in which the second layer 122 and the third layer 123 are successively laminated on the first layer 121.

Accordingly, in the wiring board 1A, the insulating layer 12A includes the third layer 123 that is laminated on the second layer 122 and includes no reinforcing material, and the rigidity of this third layer 123 is lower than the rigidity of the first layer 121.

As described above, from the viewpoint of obtaining good embeddability of the resin, it is preferable that the thickness $T_{121}$ of the first layer 121 is larger than the thickness $T_{11}$ of the interconnect layer 11. However, when the first layer 121 is made thick, the shrinkage force on the side of the first layer 121 increases, and a downwardly convex warp may be generated on the side of the interconnect layer 11. In this case, by providing the third layer 123 having the rigidity lower than the rigidity of the first layer 121 on the side of the second layer 122 opposite from the first layer 121, it is possible to reduce the downwardly convex warp from being generating on the side of the interconnect layer 11.

The upper surface of the third layer 123 may be polished after being laminated on the second layer 122, to easily adjust the thickness of the third layer 123. Hence, the thickness of the third layer 123 after the polishing can be made thin to approximately several μm, for example.

The interconnect layer 14 having the interconnect density higher than the interconnect density of the interconnect layer 11 is formed on the upper surface of the third layer 123. For this reason, the upper surface of the third layer 123 after the polishing is preferably as smooth as possible. By including no reinforcing material in the third layer 123, the upper surface of the third layer 123 after the polishing can easily be made smooth.

When the same thermosetting resin is used as the main component of the first layer 121 and the third layer 123, only the thickness factor needs to be taken into consideration in order to make the rigidity of the third layer 123 lower than the rigidity of the first layer 121, and the rigidity of the third layer 123 can be adjusted with ease.

First Application of First Embodiment

In a first application of the first embodiment, a laminated wiring board includes the wiring board according to the first embodiment mounted on the base board. In the first application of the first embodiment, those parts that are the same as those corresponding part of the first embodiment are designated by the same reference numerals, and a description thereof may be omitted.

Figure 9:
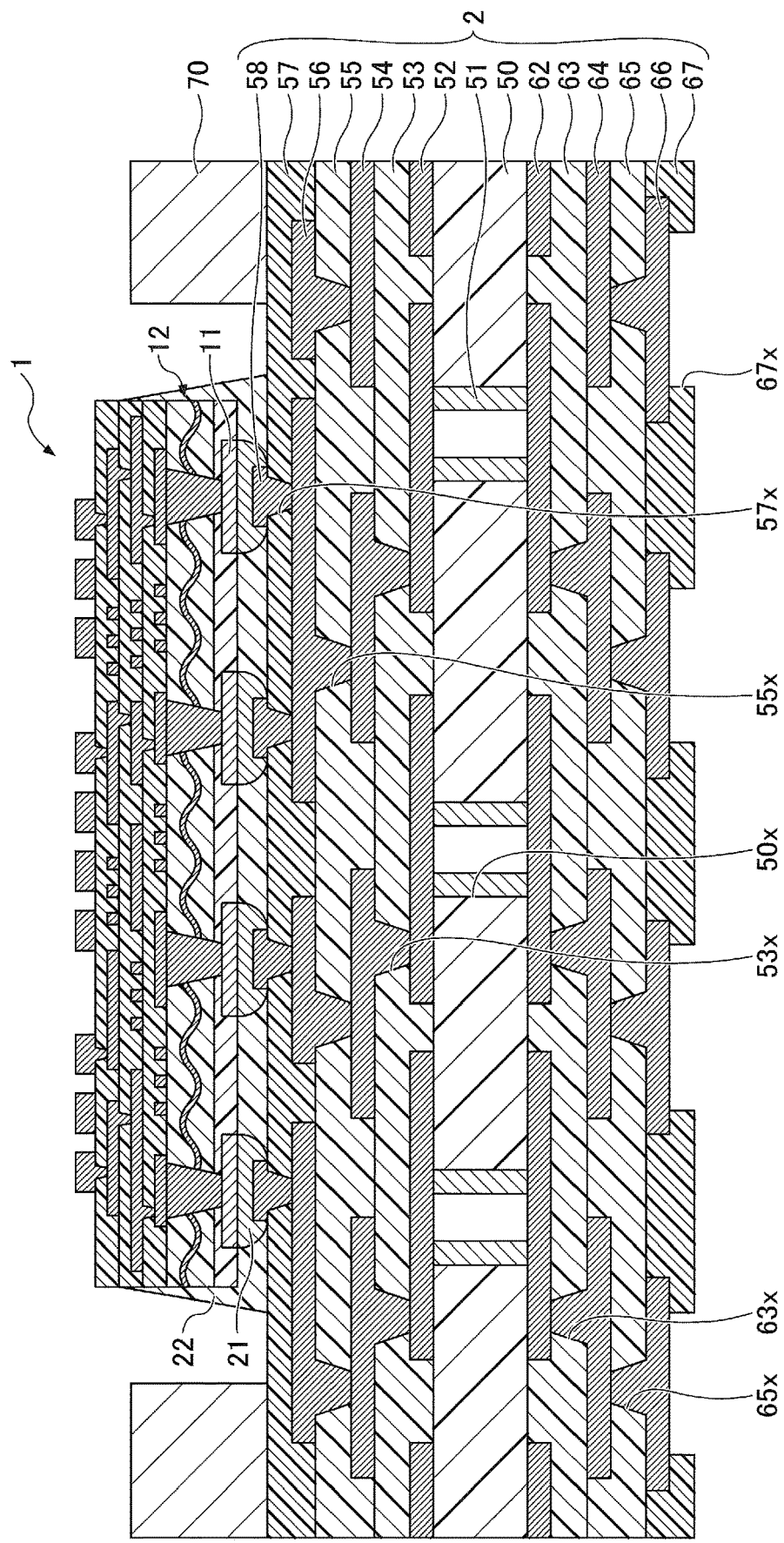
FIG. 9 is a cross sectional view illustrating an example of a laminated wiring board according to a first application of the first embodiment.

FIG. 9 is a cross sectional view illustrating an example of the laminated wiring board according to the first application of the first embodiment. As illustrated in FIG. 9, a laminated wiring board 3 is a multi-layer wiring board including the wiring board 1 mounted on a base board 2.

The base board 2 is a multi-layer wiring board that includes an interconnect layer and an insulating layer laminated on both upper and lower surfaces of a core layer 50, and may be manufactured by a known build-up process, for example. Each interconnect layer included in the base board 2 has an interconnect density lower than (or, a line and space L/S wider than) those of the interconnect layers 14, 16, 18, and 20 of the wiring board 1. The line and space L/S of each interconnect layer included in the base board 2 may be approximately 20 μm/20 μm, for example.

In the base board 2, an interconnect layer 52, an insulating layer 53, an interconnect layer 54, an insulating layer 55, an interconnect layer 56, a solder resist layer 57, and an interconnect layer 58 are successively laminated on the upper surface of the core layer 50 in FIG. 9. In addition, an interconnect layer 62, an insulating layer 63, an interconnect layer 64, an insulating layer 65, an interconnect layer 66, and a solder resist layer 67 are successively laminated on the lower surface of the core layer 50 in FIG. 9.

The so-called glass epoxy base or the like, including a glass cloth impregnated with an insulating resin such as an epoxy resin or the like, may be used for the core layer 50. The core layer 50 may include woven fabric, unwoven fabric, or the like made of glass fibers, carbon fibers, aramid fibers, or the like, impregnated with an epoxy resin, polyimide resin, or the like, for example. The core layer 50 may have a thickness of approximately 60 μm to approximately 400 μm, for example. The core layer 50 includes through-holes 50x penetrating the core layer 50 along a thickness direction thereof. The through-holes 50x may have a planar shape that is a circular shape, for example.

The interconnect layer 52 is formed on the upper surface of the core layer 50. In addition, the interconnect layer 62 is formed on the lower surface of the core layer 50. The interconnect layer 52 and the interconnect layer 62 are electrically connected via a through interconnect 51 that is formed within the through-hole 50x. Each of the interconnect layers 52 and 62 is patterned to a predetermined planar shape. The material used for the interconnect layers 52 and 62 and the through interconnect 51 may be copper (Cu) or the like, for example. The thickness of each of the interconnect layers 52 and 62 may be approximately 10 μm to approximately 30 μm, for example. The interconnect layer 52, the interconnect layer 62, and the through interconnect 51 may be integrally formed.

The insulating layer 53 is formed on the upper surface of the core 50, to cover the interconnect layer 52. Examples of the material used for the insulating layer 53 include insulating resins, including, as the main component thereof, epoxy resins, polyimide resins, or the like, for example. The insulating layer 53 may have a thickness of approximately 30 μm to approximately 40 μm, for example. The insulating layer 53 may include a filler made of silica ($SiO_2$) or the like.

The interconnect layer 54 is formed on the upper surface of the insulating layer 53. The interconnect layer 54 includes a via interconnect (or through-hole interconnect) filling the inside of each via hole 53x penetrating the insulating layer 53 and exposing the upper surface of the interconnect layer 52, and an interconnect pattern formed on the upper surface of the insulating layer 53. The interconnect pattern forming the interconnect layer 54 is electrically connected to the interconnect layer 52 through the via interconnect. The via hole 53x may be a cavity having an inverted trapezoidal shape so that the diameter of the opening that opens toward the insulating layer 55 is larger than the diameter of the bottom face of the opening formed by the upper surface of the interconnect layer 52. The material and the thickness of the interconnect pattern of the interconnect layer 54 may be similar to those of the interconnect layer 52, for example.

The insulating layer 55 is formed on the upper surface of the insulating layer 53, to cover the interconnect layer 54. The material and the thickness of the insulating layer 55 may be similar to those of the insulating layer 53, for example. The insulating layer 55 may include a filler made of silica ($SiO_2$) or the like.

The interconnect layer 56 is formed on the upper surface of the insulating layer 55. The interconnect layer 56 includes a via interconnect (or through-hole interconnect) filling the inside of each via hole 55x penetrating the insulating layer 55 and exposing the upper surface of the interconnect layer 54, and an interconnect pattern formed on the upper surface of the insulating layer 55. The interconnect pattern forming the interconnect layer 56 is electrically connected to the interconnect layer 54 through the via interconnect. The via hole 55x may be a cavity having an inverted trapezoidal shape so that the diameter of the opening that opens toward the insulating layer 57 is larger than the diameter of the bottom face of the opening formed by the upper surface of the interconnect layer 54. The material and the thickness of the interconnect pattern of the interconnect layer 56 may be similar to those of the interconnect layer 52, for example.

The solder resist layer 57 is formed on the upper surface of the insulating layer 55, to cover the interconnect layer 56. The solder resist layer 57 may be made of a photosensitive resin or the like, including epoxy resins, acrylic resins, or the like, for example. The solder resist layer 57 may have a thickness of approximately 15 μm to approximately 35 μm, for example.

The interconnect layer 58 is formed on the upper surface of the solder resist layer 57. The interconnect layer 58 includes a via interconnect (or through-hole interconnect) filling the inside of each via hole 57x penetrating the solder resist layer 57 and exposing the upper surface of the interconnect layer 56, and pads formed on the upper surface of the solder resist layer 57. The pads forming the interconnect layer 58 are electrically connected to the interconnect layer 56 through the via interconnect. The via hole 57x may be a cavity having an inverted trapezoidal shape so that the diameter of the opening that opens toward the wiring board 1 is larger than the diameter of the bottom face of the opening formed by the upper surface of the interconnect layer 56. The material and the thickness of the pads of the interconnect layer 58 may be similar to those of the interconnect layer 52, for example. The pads forming the interconnect layer 58 may have a planar shape that is a circular shape, for example. A surface-treated layer may be formed on the surface (only on the upper surface, or on both the upper surface and the side surfaces) of the pads forming the interconnect layer 58, if necessary, by performing the surface treatment described above.

The insulating layer 63 is formed on the lower surface of the core 50, to cover the interconnect layer 62. The material and the thickness of the insulating layer 63 may be similar to those of the insulating layer 53, for example. The insulating layer 63 may include a filler made of silica ($SiO_2$) or the like.

The interconnect layer 64 is formed on the lower surface of the insulating layer 63. The interconnect layer 64 includes a via interconnect (or through-hole interconnect) filling the inside of each via hole 63x penetrating the insulating layer 63 and exposing the lower surface of the interconnect layer 62, and an interconnect pattern formed on the lower surface of the insulating layer 63. The interconnect pattern forming the interconnect layer 64 is electrically connected to the interconnect layer 62 through the via interconnect. The via hole 63x may be a cavity having a trapezoidal shape so that the diameter of the opening that opens toward the insulating layer 65 is larger than the diameter of the bottom face of the opening formed by the lower surface of the interconnect layer 62. The material and the thickness of the interconnect pattern of the interconnect layer 64 may be similar to those of the interconnect layer 52, for example.

The insulating layer 65 is formed on the lower surface of the insulating layer 63, to cover the interconnect layer 64. The material and the thickness of the insulating layer 65 may be similar to those of the insulating layer 53, for example. The insulating layer 65 may include a filler made of silica ($SiO_2$) or the like.

The interconnect layer 66 is formed on the lower surface of the insulating layer 65. The interconnect layer 66 includes a via interconnect (or through-hole interconnect) filling the inside of each via hole 65x penetrating the insulating layer 65 and exposing the lower surface of the interconnect layer 64, and an interconnect pattern formed on the lower surface of the insulating layer 65. The interconnect pattern forming the interconnect layer 66 is electrically connected to the interconnect layer 64 through the via interconnect. The via hole 65x may be a cavity having a trapezoidal shape so that the diameter of the opening that opens toward the insulating layer 67 is larger than the diameter of the bottom face of the opening formed by the lower surface of the interconnect layer 64. The material and the thickness of the interconnect pattern of the interconnect layer 66 may be similar to those of the interconnect layer 52, for example.

The solder resist layer 67 is formed on the lower surface of the insulating layer 65, to cover the interconnect layer 66. The material and thickness of the solder resist layer 67 may be similar to those of the solder resist layer 57, for example. The solder resist layer 67 includes openings 67x, and parts of the lower surface of the interconnect layer 66 are exposed within the openings 67x. The openings 67x may have a planar shape that is a circular shape, for example. The interconnect layer 66 exposed within the openings 67x may be used as pads for making electrical connection to a mounting board (not illustrated), such as a mother board or the like. A surface-treated layer may be formed on the lower surface of the interconnect layer 58 exposed within the openings 67x, if necessary, by performing the surface treatment described above.

The wiring board 1 is mounted on the base board 2. More particularly, the interconnect layer 11 forming the external connection terminals of the wiring board 1, and the interconnect layer 58 forming the external connection terminals of the base board 2, are connected by the solder layer 21 which is melted and thereafter hardens. In addition, the bonding layer 22, which is melted and thereafter cures, is filled between the lower surface of the wiring board 1 (lower surface of the insulating layer 12) and the upper surface of the base board 2 (upper surface of the solder resist layer 57), to cover parts of the side surfaces of the wiring board 1, to bond the wiring board 1 and the base board 2 together.

A stiffener 70 is fixed to the outer peripheral part on the upper surface of the base board 2 (the upper surface of the solder resist layer 57). The stiffener 70 has a planar shape that is a frame shape, for example. The stiffener 70 is provided to reinforce the strength of the entire laminated wiring board 3, and to reduce the warp when the laminated wiring board 3 is mounted on the mother board or the like. Examples of the material used for the stiffener 70 include SUS304 (stainless steel including Cr and Ni as a main component thereof: 0.08 C-18Cr-8Ni) or the like, for example. The stiffener 70 may also be made of a metal plate made of copper, copper alloys, or the like, or a resin plate made of a glass epoxy or the like, for example. The stiffener 70 may be provided, if necessary.

Accordingly, by mounting the wiring board 1 including the interconnect layer having the high interconnect density on the base board 2 including the interconnect layer having the low interconnect density, it is possible to easily manufacture the laminated wiring board 3 on which the semiconductor chip may be mounted.

In addition, because the warp generated in the wiring board 1 is reduced, the distance between the interconnect layer 11 of the wiring board 1 and the opposing interconnect layer 58 of the base board 2 can be stably maintained approximately constant. For this reason, it is possible to improve the reliability of the connection between the interconnect layer 11 and the interconnect layer 58 via the solder layer 21.

Second Application of First Embodiment

In a second application of the first embodiment, the laminated wiring board includes the wiring board according to the first embodiment mounted on the base board. In the second application of the first embodiment, those parts that are the same as those corresponding part of the first embodiment are designated by the same reference numerals, and a description thereof may be omitted.

Figure 10:
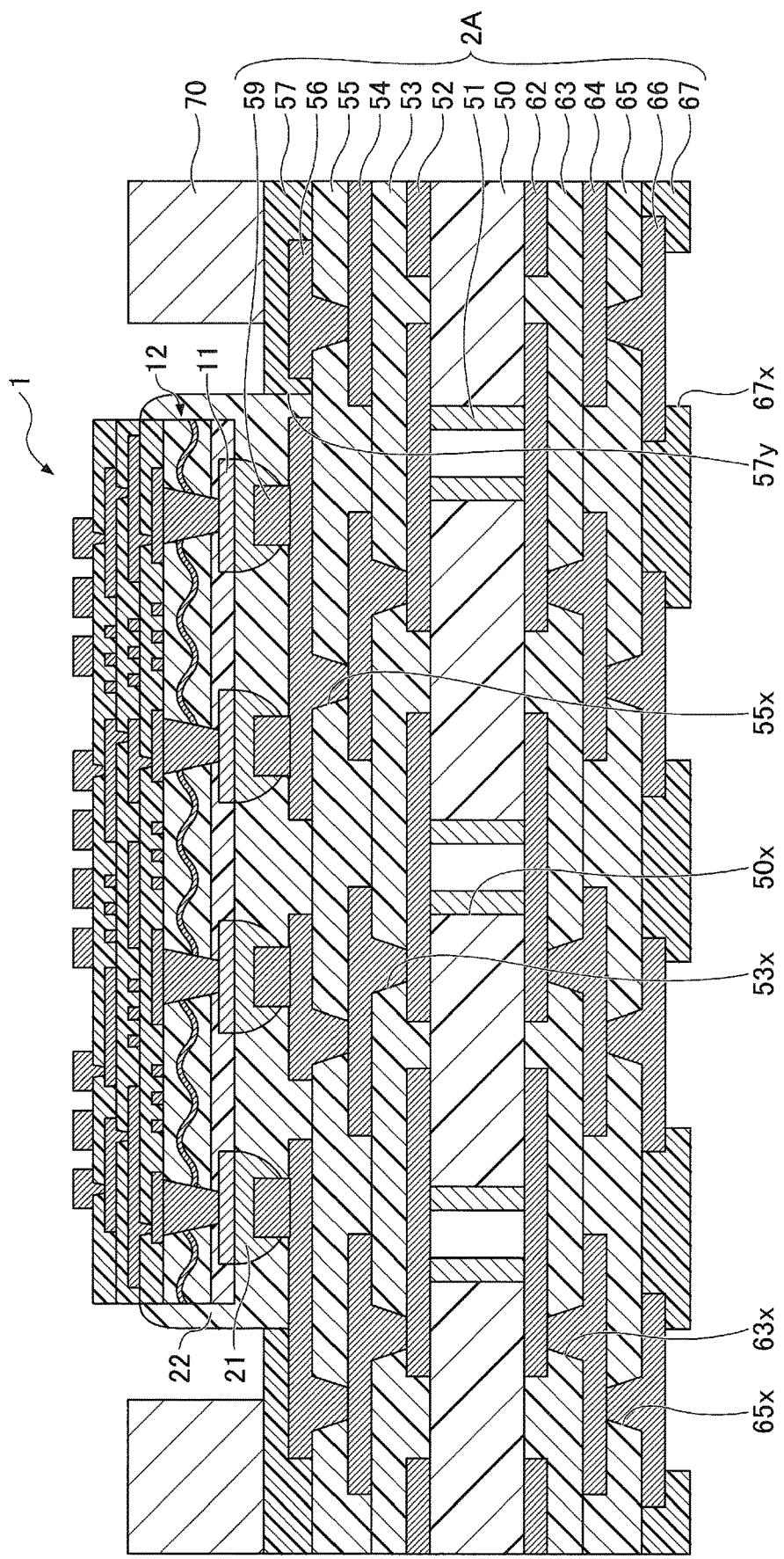
FIG. 10 is a cross sectional view illustrating an example of the laminated wiring board according to a second application of the first embodiment.

FIG. 10 is a cross sectional view illustrating an example of the laminated wiring board according to the second application of the first embodiment. As illustrated in FIG. 10, a laminated wiring board 3A differs from the laminated wiring board 3 illustrated in FIG. 9, in that the base board 2 is replaced by a base board 2A.

In the base board 2A, openings 57y is provided in the solder resist layer 57 to expose an inner peripheral side of the solder resist layer 57. Pads 59 made of copper or the like are formed on the upper surface of the interconnect layer 56 exposed within the openings 57y, at positions corresponding to the interconnect layer 11 of the wiring board 1. The interconnect layer 11 forming the external connection terminals of the wiring board 1, and the pads 59 forming the external connection terminals of the base board 2A, are connected by the solder layer 21 which is melted and thereafter hardens.

In addition, the bonding layer 22, which is melted and thereafter cures, is filled between the lower surface of the wiring board 1 (lower surface of the insulating layer 12) and the upper surface of the base board 2A (upper surface of the insulating layer 55 exposed within the openings 57y in the solder resist layer 57), to cover parts of the side surfaces of the wiring board 1, to bond the wiring board 1 and the base board 2A together.

Accordingly, in the base board on which the wiring board 1 is mounted, the structure of the part of the base board connected to the interconnect layer 11 of the wiring board 1 is not particularly limited, and may have an arbitrary structure.

Third Application of First Embodiment

In a third application of the first embodiment, a semiconductor device includes a semiconductor chip mounted on the laminated wiring board according to the first application of the first embodiment. In the third application of the first embodiment, those parts that are the same as those corresponding part of the first embodiment are designated by the same reference numerals, and a description thereof may be omitted.

Figure 11:
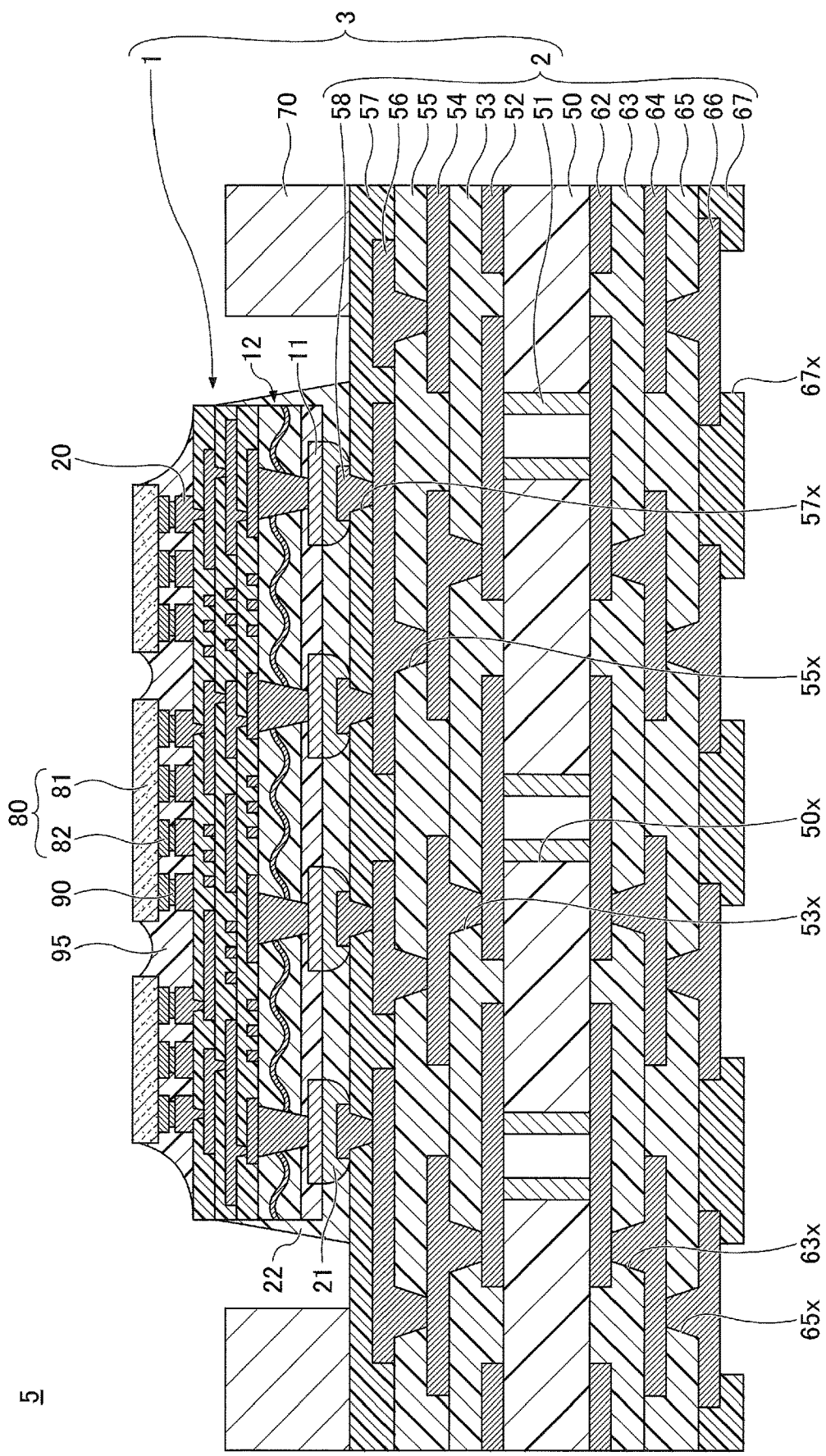
FIG. 11 is a cross sectional view illustrating an example of a semiconductor device according to a third application of the first embodiment.

FIG. 11 is a cross sectional view illustrating an example of the semiconductor device according to the third application of the first embodiment. As illustrated in FIG. 11, a semiconductor device 5 includes the laminated wiring board 3 illustrated in FIG. 9, a plurality of semiconductor chips 80, a plurality of bumps 90, and an underfill resin 93. The plurality of semiconductor chips 80 are mounted on the laminated wiring board 3 by flip-chip bonding.

The semiconductor chip 80 includes a semiconductor integrated circuit (not illustrated) or the like formed on a thin semiconductor substrate 81 made of silicon (Si) or the like, for example. A plurality of electrode pads 82, electrically connected to the semiconductor integrated circuit (not illustrated), are formed on a circuit forming surface of the semiconductor substrate 81.

The electrode pads 82 of the semiconductor chip 80 are electrically connected to the interconnect layer 20 of the laminated wiring board 3, via the bumps 90. The underfill resin 95 is filled between the circuit forming surface of the semiconductor chip 80 and the upper surface of the wiring board 1, to cover the side surfaces of the semiconductor chip 80. The bumps 90 may be solder bumps, for example. Examples of the material used for the solder bump include SnBi solder or the like, for example.

The semiconductor chips 80 may have the same size, or may have different sizes. In addition, the semiconductor chips 80 may be capable of performing the same function, or may be capable of performing different functions. Examples of the functions that may be performed by the semiconductor chips 80 include memory functions, such as Dynamic Random Access Memory (DRAM) functions or the like, logic functions, such as Central Processing Unit (CPU) functions or the like, for example. In addition, the number of semiconductor chips 80 mounted on the laminated wiring board 3 is not limited to three, as illustrated in FIG. 11, and may be one, two, or four or more.

The semiconductor device 5 can be formed by mounting the semiconductor chips 80 on the laminated wiring board 3 according to the first application of the first embodiment. Because the semiconductor chips 80 are mounted on the wiring board 1 including the interconnect layer having the high interconnect density, it is possible to easily achieve signal connections between the semiconductor chips 80 using the interconnect patterns having the high interconnect density. Of course, the laminated wiring board 3A may be used in place of the laminated wiring board 3.

[Simulation of Warp]
[First Exemplary Implementation]

The warp of the wiring board (hereinafter referred to as a "wiring board A") having the structure illustrated in FIG. 1 was simulated for a case where the wiring board A is heated and thereafter returned to room temperature. More particularly, the planar shape of the wiring board A was a rectangular shape that is 31 mm×44 mm. The thickness $T_{122}$ of the second layer 122 was fixed to 30 µm. The simulation of the warp of the wiring board A was performed by varying the thickness $T_{121}$ of the first layer 121 to 5 µm, 10 µm, 15 µm, 20 µm, 25 µm and 30 µm. In addition, the warp of the wiring board (hereinafter referred to as a "wiring board X") according to a comparison example including no first layer 121 was also simulated.

Figure 12:
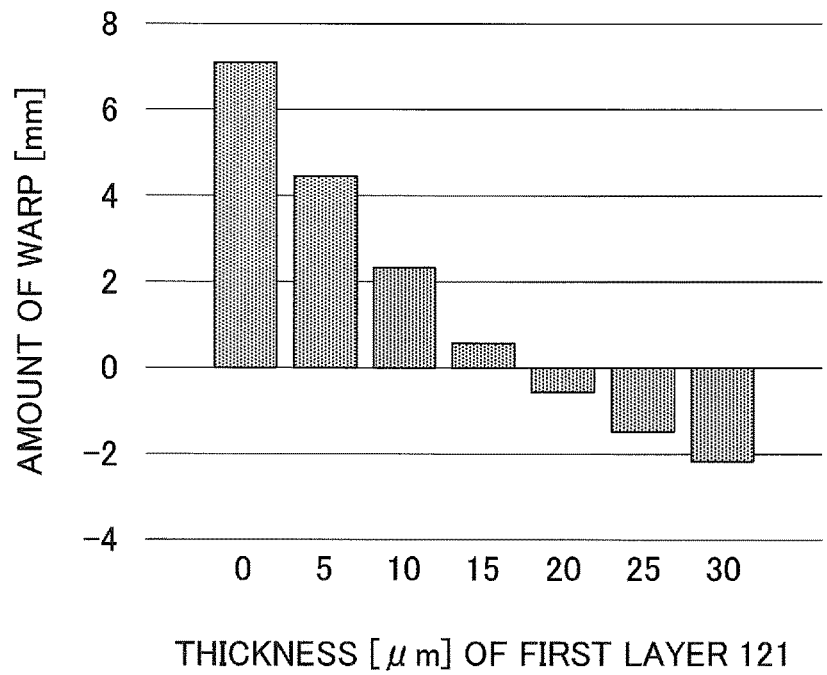
FIG. 12 is a graph illustrating simulation results of a first exemplary implementation.

Simulation results of a first exemplary implementation are illustrated in Table 1 and FIG. 12. FIG. 12 is a graph illustrating the simulation results of the first exemplary implementation.

In Table 1, and Tables 2 and 3 which will be described later, No. 1 through No. 7 denote numbers assigned to samples, $T_{123}$ [µm] denotes the thickness of the third layer 123, $T_{122}$ [µm] denotes the thickness of the second layer 122, $T_{121}$ [µm] denotes the thickness of the first layer 121, $W_a$ [mm] denotes the amount of warp, and $D_w$ denotes the direction of warp. The direction of warp, $D_w$, indicated by a symbol "U" indicates a downwardly convex warp (or upwardly concave warp). On the other hand, the direction of warp, $D_w$, indicated by a symbol "∩" indicates an upwardly convex warp (or downwardly concave warp).

TABLE 1

| | No. | | | | | | |
|---|---|---|---|---|---|---|---|
| | 1 | 2 | 3 | 4 | 5 | 6 | 7 |
| $T_{123}$ [µm] | — | — | — | — | — | — | — |
| $T_{122}$ [µm] | 30 | 30 | 30 | 30 | 30 | 30 | 30 |
| $T_{121}$ [µm] | 0 | 5 | 10 | 15 | 20 | 25 | 30 |
| $W_a$ [mm] | 7.1 | 4.5 | 2.3 | 0.7 | 0.6 | 1.5 | 2.2 |
| $D_w$ | U | U | U | U | ∩ | ∩ | ∩ |

As illustrated in Table 1 and FIG. 12, the downwardly convex warp, curving downward from the interconnect layer 11, is generated in the wiring board X of the comparison example (in which the first layer 121 has the thickness $T_{121}$=0 µm), and the amount of warp, $W_a$, is 7.1 mm. This amount of warp, $W_a$, is the distance between the center of the lower surface of the wiring board A or X, and a vertex of the lower surface of the wiring board A or X, along the thickness direction of the wiring board A or X. In the case of the upwardly convex warp, for example, the center of the lower surface of the wiring board A or X may have a highest position along the thickness direction, and the vertex of the lower surface of the wiring board A or X may have a lowest position along the thickness direction. On the other hand, in the case of the downwardly convex warp, for example, the center of the lower surface of the wiring board A or X may have the lowest position along the thickness direction, and the vertex of the lower surface of the wiring board A or X may have the highest position along the thickness direction.

On the other hand, when the first layer 121 having the thickness $T_{121}$ of 5 μm is provided, the downwardly convex warp, curving downward from the interconnect layer 11, is also generated in the wiring board A of the first exemplary implementation, but the amount of warp, $W_a$, is 4.5 mm and reduced compared to that of the wiring board X. The amount of warp, $W_a$, is further reduced as the thickness $T_{121}$ of the first layer 121 is increased further, and is 2.3 mm when the first layer 121 has the thickness $T_{121}$=10 μm, and is 0.7 mm when the first layer 121 has the thickness $T_{121}$=15 pin. The direction of the warp changes to the upwardly convex warp, curving upward from the interconnect layer 11, is generated in the wiring board A of the first exemplary implementation when the first layer 121 has the thickness $T_{121}$=20 μm, and the amount of warp, $W_a$, is 0.6 mm. The amount of warp, $W_a$, of the upwardly convex warp increases as the thickness $T_{121}$ of the first layer 121 is increased further, and is 1.5 mm when the first layer 121 has the thickness $T_{121}$=25 μm, and is 2.2 mm when the first layer 121 has the thickness $T_{121}$=30 μm.

Accordingly, it was confirmed that the warp of the wiring board A can be reduced by providing the first layer 121, having a suitable thickness $T_{121}$ and the CTE higher than that of the second layer 122, under the second layer 122. It may be regarded that the warp of the wiring board A is reduced because, when the wiring board A is heated and thereafter returned to room temperature as described above, the first layer 121 contracts more than the second layer 122, to generate a force which acts in a direction opposite to, that is, in a direction to reduce or cancel the downwardly convex warp on the second side of the wiring board 1 closer to the interconnect layer 11.

[Second Exemplary Implementation]

The warp of the wiring board (hereinafter referred to as a "wiring board B") having the structure illustrated in FIG. 8 was simulated for a case where the wiring board B is heated and thereafter returned to room temperature. More particularly, the planar shape of the wiring board B was a rectangular shape that is 31 mm×44 mm. The thickness $T_{121}$ of the first layer 121 was fixed to 25 μm, and the thickness $T_{122}$ of the second layer 122 was fixed to 30 μm. The simulation of the warp of the wiring board B was performed by varying the thickness $T_{123}$ of the third layer 123 to 5 μm, 10 μm, 15 μm, 20 μm, 25 μm and 30 μm. The same material was used for the first layer 121 and the third layer 123. The case where the third layer 123 has the thickness $T_{123}$=0 μm corresponds to the structure of the wiring board A according to the first exemplary implementation.

Figure 13:
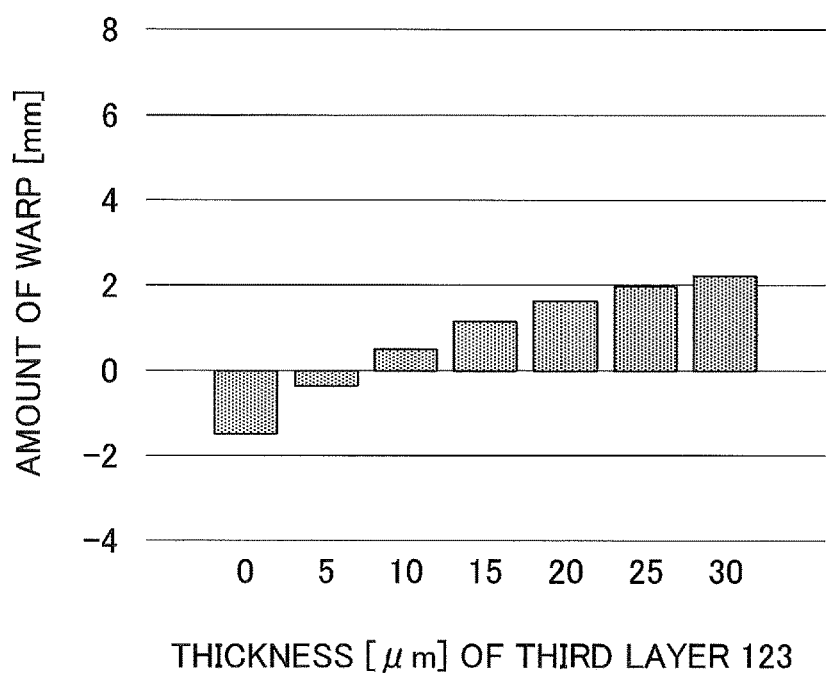
FIG. 13 is a graph illustrating the simulation results of a second exemplary implementation.

Simulation results of a second exemplary implementation are illustrated in Table 2 and FIG. 13. FIG. 13 is a graph illustrating the simulation results of the second exemplary implementation.

TABLE 2

| | No. | | | | | | |
|---|---|---|---|---|---|---|---|
| | 1 | 2 | 3 | 4 | 5 | 6 | 7 |
| $T_{123}$ [μm] | 0 | 5 | 10 | 15 | 20 | 25 | 30 |
| $T_{122}$ [μm] | 30 | 30 | 30 | 30 | 30 | 30 | 30 |
| $T_{121}$ [μm] | 25 | 25 | 25 | 25 | 25 | 25 | 25 |
| $W_a$ [mm] | 1.5 | 0.4 | 0.5 | 1.1 | 1.6 | 2.0 | 2.2 |
| $D_w$ | ∩ | ∩ | U | U | U | U | U |

As illustrated in Table 2 and FIG. 13, when the third layer 123 has the thickness $T_{123}$=0 μm, the downwardly convex warp, curving downward from the interconnect layer 11, is generated in the wiring board B of the second exemplary implementation, and the amount of warp, $W_a$, is 1.5 mm which is the same as the simulation result for the sample No. 6 of the first exemplary implementation.

On the other hand, when the third layer 123 having the thickness $T_{123}$ of 5 μm is provided, the upwardly convex warp, curving upward from the interconnect layer 11, is generated in the wiring board B of the second exemplary implementation, but the amount of warp, $W_a$, is 0.4 mm and reduced. The direction of the warp changes to the downwardly convex warp, curving downward from the interconnect layer 11, and the amount of warp, $W_a$, is 0.5 mm when the third layer 123 has the thickness $T_{123}$=10 μm. The amount of warp, $W_a$, of the downwardly convex warp increases as the thickness $T_{123}$ of the third layer 123 is increased further, and is 1.1 mm when the third layer 123 has the thickness $T_{123}$=15 μm, 1.6 mm when the third layer 123 has the thickness $T_{123}$=20 μm, 2.0 mm when the third layer 123 has the thickness $T_{123}$=25 μm, and is 2.2 mm when the third layer 123 has the thickness $T_{123}$=30 μm.

Accordingly, it was confirmed that the warp of the wiring board B can be reduced by providing the third layer 123, having a suitable thickness $T_{123}$ and the rigidity lower than that of the first layer 121, on the second layer 122. It may be regarded that the warp of the wiring board B is reduced because, when the wiring board B is heated and thereafter returned to room temperature as described above, the third layer 123 contracts in a direction to generate the warp in a direction opposite to that of the first layer 121, to generate a force which acts in a direction opposite to, that is, in a direction to reduce or cancel the upwardly convex warp on the second side of the wiring board 1 closer to the interconnect layer 11. Particularly when the thickness $T_{121}$ of the first layer 121 is made larger than a predetermined value from a viewpoint of obtaining a good embeddability, the thickness $T_{123}$ of the third layer 123 can be adjusted to suitably reduce the upwardly convex warp curving upward from the interconnect layer 11.

[Third Exemplary Implementation]

The warp of the wiring board having the structure illustrated in FIG. 8 was simulated for a case where the wiring board B is heated and thereafter returned to room temperature. The simulation was performed under conditions similar to those of the second exemplary implementation, except that the thickness $T_{121}$ of the first layer 121 is fixed to 30 μm for a third exemplary implementation.

Figure 14:
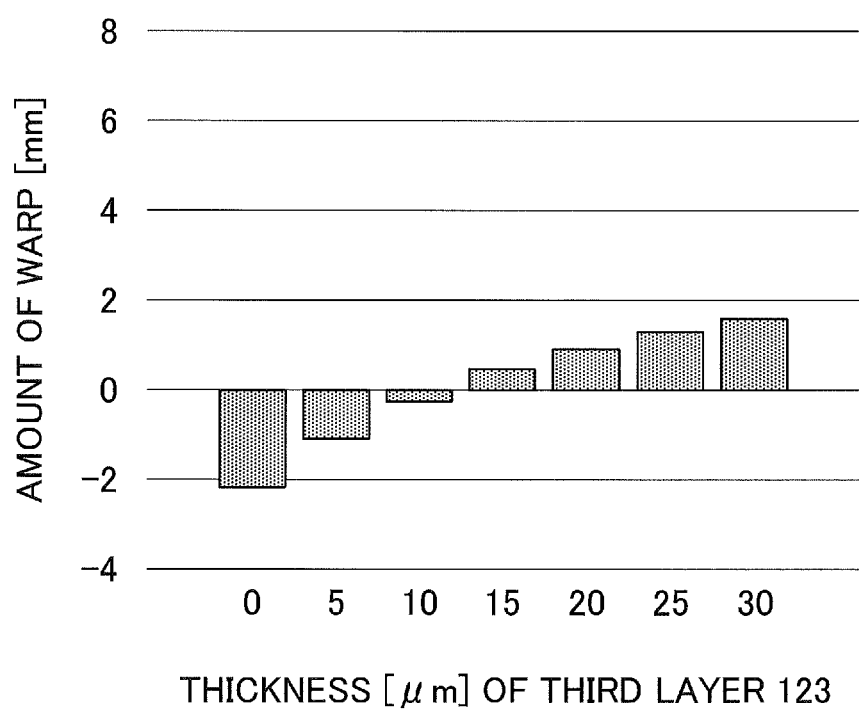
FIG. 14 is a graph illustrating the simulation results of a third exemplary implementation.

Simulation results of a third exemplary implementation are illustrated in Table 3 and FIG. 14. FIG. 14 is a graph illustrating the simulation results of the third exemplary implementation.

TABLE 3

| | No. | | | | | | |
|---|---|---|---|---|---|---|---|
| | 1 | 2 | 3 | 4 | 5 | 6 | 7 |
| $T_{123}$ [μm] | 0 | 5 | 10 | 15 | 20 | 25 | 30 |
| $T_{122}$ [μm] | 30 | 30 | 30 | 30 | 30 | 30 | 30 |
| $T_{121}$ [μm] | 30 | 30 | 30 | 30 | 30 | 30 | 30 |
| $W_a$ [mm] | 2.2 | 1.1 | 0.3 | 0.5 | 0.9 | 1.3 | 1.6 |
| $D_w$ | ∩ | ∩ | ∩ | U | U | U | U |

As illustrated in Table 3 and FIG. 14, even when the thickness $T_{121}$ of the first layer 121 becomes 30 μm and larger than that of the second exemplary implementation, it was confirmed that the upwardly convex warp, curving upward from the interconnect layer 11, can be reduced by adjusting the thickness $T_{123}$ of the third layer 123 in an increasing direction. In addition, even when the thickness $T_{121}$ of the first layer 121 becomes even larger than that of the third exemplary implementation, it may be readily understood that the upwardly convex warp, curving upward from the interconnect layer 11, can be reduced by adjusting the thickness $T_{123}$ of the third layer 123 in the increasing direction.

Accordingly to each of the embodiments described above, it is possible to provide a wiring board including an interconnect layer having a high interconnect density, a high rigidity, and reduced warp.

Although the exemplary implementations are numbered with, for example, "first," "second," or "third," the ordinal numbers do not imply priorities of the exemplary implementations. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the base board 2 and the base board 2A, on which the wiring board 1 is mounted, are wiring boards having the core layer manufactured by the build-up process in the described embodiment. However, the wiring board 1 may be mounted on wiring boards other than such base boards 2 and 2A. The wiring board on which the wiring board 1 is mounted, may be a coreless wiring board manufactured by the build-up process, for example. The wiring board on which the wiring board 1 is mounted, may be other wiring boards, including a silicon substrate, a ceramic substrate, or the like, for example.

What is claimed is:

1. A wiring board comprising:
   a first interconnect layer;
   a first insulating layer covering the first interconnect layer;
   a second interconnect layer, thinner than the first interconnect layer, formed on a first surface of the first insulating layer, the second interconnect layer having an interconnect density higher than an interconnect density of the first interconnect layer;
   a second insulating layer, formed on the first surface of the first insulating layer, and covering the second interconnect layer; and
   a third interconnect layer,
   wherein the first insulating layer includes a first layer including no reinforcing material and covering the first interconnect layer, and a second layer including a reinforcing material and laminated directly on the first layer,
   wherein the third interconnect layer integrally penetrates the first layer and the second layer and electrically connects the first interconnect layer and the second interconnect layer,
   wherein the first layer and the second layer respectively include a non-photosensitive thermosetting resin as a main component thereof,
   wherein the first layer has a coefficient of thermal expansion higher than a coefficient of thermal expansion of the second layer,
   wherein the second insulating layer includes a photosensitive resin as a main component thereof, and
   wherein the second interconnect layer includes an interconnect formed directly on the first surface of the first insulating layer and electrically connected to the first interconnect layer.

2. The wiring board as claimed in claim 1, wherein
   the first insulating layer includes a third layer laminated on the second layer and including no reinforcing material, and
   the third layer includes a non-photosensitive thermosetting resin as a main component thereof, and has a rigidity lower than a rigidity of the first layer.

3. The wiring board as claimed in claim 2, wherein
   the third layer includes, as the main component thereof, the non-photosensitive thermosetting resin identical to that forming the main component of the first layer, and
   the third layer is thinner than the first layer.

4. The wiring board as claimed in claim 1, wherein one surface, located on a side closer to the first insulating layer, and side surfaces of the first interconnect layer, are covered by the first layer.

5. The wiring board as claimed in claim 1, wherein the first surface of the first insulating layer is smoother than a second surface of the first insulating layer opposite to the first surface of the first insulating layer.

6. The wiring board as claimed in claim 5, further comprising:
   a fourth interconnect layer, thinner than the first interconnect layer, formed on a first surface of the second insulating layer, the fourth interconnect layer having an interconnect density higher than the interconnect density of the first interconnect layer; and
   a third insulating layer, formed on the first surface of the second insulating layer, and covering the fourth interconnect layer,
   wherein the third insulating layer includes a photosensitive resin as a main component thereof, and
   wherein the first surface of the second insulating layer is smoother than the first surface of the first insulating layer.

7. The wiring board as claimed in claim 1, wherein
   the third interconnect layer is a via interconnect embedded in the first insulating layer and filling a via hole that penetrates the first layer and the second layer of the first insulating layer,
   one end face of the via interconnect is exposed from the first surface of the first insulating layer and is directly connected to the second interconnect layer, and
   the other end face of the via interconnect is directly connected to the first interconnect layer inside the first insulating layer.

8. The wiring board as claimed in claim 1, wherein
   the first interconnect layer is an external connection terminal, and
   one surface of the first interconnect layer is exposed from one surface of the first layer.

9. The wiring board as claimed in claim 8, further comprising:
   a solder layer formed on the one surface of the first interconnect layer; and
   a bonding layer, formed on the one surface of the first layer, and covering the solder layer.

10. A laminated wiring board comprising:
a base board; and
the wiring board according to claim 1, mounted on the base board,
wherein the first interconnect layer and an external connection terminal of the base board are connected.

11. The laminated wiring board as claimed in claim 10, wherein
the first insulating layer of the wiring board includes a third layer laminated on the second layer and including no reinforcing material, and
the third layer includes a non-photosensitive thermosetting resin as a main component thereof, and has a rigidity lower than a rigidity of the first layer.

12. The laminated wiring board as claimed in claim 11, wherein
the third layer includes, as the main component thereof, the non-photosensitive thermosetting resin identical to that forming the main component of the first layer, and
the third layer is thinner than the first layer.

13. The laminated wiring board as claimed in claim 10, wherein one surface, located on a side closer to the first insulating layer, and side surfaces of the first interconnect layer of the wiring board, are covered by the first layer.

14. The laminated wiring board as claimed in claim 10, wherein the first surface of the first insulating layer of the wiring board is smoother than a second surface of the first insulating layer opposite to the first surface of the first insulating layer.

15. A semiconductor device comprising:
the laminated wiring board according to claim 10; and
a semiconductor chip mounted on the wiring board of the laminated wiring board.

16. The semiconductor device as claimed in claim 15, wherein
the first insulating layer of the wiring board includes a third layer laminated on the second layer and including no reinforcing material, and
the third layer includes a non-photosensitive thermosetting resin as a main component thereof, and has a rigidity lower than a rigidity of the first layer.

17. The semiconductor device as claimed in claim 16, wherein
the third layer includes, as the main component thereof, the non-photosensitive thermosetting resin identical to that forming the main component of the first layer, and
the third layer is thinner than the first layer.

18. The semiconductor device as claimed in claim 15, wherein one surface, located on a side closer to the first insulating layer, and side surfaces of the first interconnect layer of the wiring board, are covered by the first layer.

19. The semiconductor device as claimed in claim 15, wherein the first surface of the first insulating layer of the wiring board is smoother than a second surface of the first insulating layer opposite to the first surface of the first insulating layer.

20. The wiring board as claimed in claim 1, wherein
the first interconnect layer is embedded in the first layer of the first insulating layer, and does not extend through the entire first layer,
the second interconnect layer is formed directly on the second layer of the first insulating layer, and
the second insulating layer is formed on the second layer of the first insulating layer, and covers the second interconnect layer.

* * * * *